US012368050B2

(12) United States Patent
Yokoi et al.

(10) Patent No.: US 12,368,050 B2
(45) Date of Patent: Jul. 22, 2025

(54) PLASMA PROCESSING METHOD AND PLASMA PROCESSING APPARATUS

(71) Applicant: Tokyo Electron Limited, Tokyo (JP)

(72) Inventors: Masahiko Yokoi, Miyagi (JP); Koki Tanaka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 247 days.

(21) Appl. No.: 17/876,307

(22) Filed: Jul. 28, 2022

(65) Prior Publication Data

US 2023/0035021 A1   Feb. 2, 2023

(30) Foreign Application Priority Data

Jul. 28, 2021   (JP) ................................ 2021-123428
Jun. 27, 2022   (JP) ................................ 2022-102519

(51) Int. Cl.
*H01L 21/311*   (2006.01)
*H01J 37/32*   (2006.01)
*H01L 21/3213*   (2006.01)

(52) U.S. Cl.
CPC .. *H01L 21/31116* (2013.01); *H01J 37/32091* (2013.01); *H01J 37/3244* (2013.01);
(Continued)

(58) Field of Classification Search
CPC ........... H01J 37/32724; H01J 37/32091; H01J 37/3244; H01J 37/32568; H01J 37/3211;
(Continued)

(56) References Cited

U.S. PATENT DOCUMENTS

2009/0159965 A1\*   6/2009   Jung .................. H01L 29/66621
                                                              438/270
2017/0330759 A1\*   11/2017   Gohira ..................... H01J 37/32
2020/0402805 A1\*   12/2020   Aoki ..................... C23C 16/505

FOREIGN PATENT DOCUMENTS

JP   2001-135617 A   5/2001
JP   2007-067218 A   3/2007
(Continued)

OTHER PUBLICATIONS

Infinity Learn, reaction of HBr with O2 (Year: 2023).\*

*Primary Examiner* — Duy Vu N Deo
(74) *Attorney, Agent, or Firm* — Procopio, Cory, Hargreaves & Savitch LLP

(57) ABSTRACT

The plasma processing method according to the present disclosure is performed in a plasma processing apparatus. The plasma processing method comprises preparing a substrate including a silicon-containing film and a carbon-containing film formed on the silicon-containing film; setting a temperature of the substrate to a first temperature of 0° C. or less; supplying $H_2O$ to the substrate using a first processing gas containing comprising at least one of (a) gas comprising hydrogen atoms and oxygen atoms, and (b) a first gas comprising hydrogen atoms and a second gas comprising oxygen atoms; forming plasma from the first processing gas using a radio frequency and etching the carbon-containing film; setting the temperature of the substrate to a second temperature different from the first temperature; supplying a second processing gas containing a hydrogen- and fluorine-containing gas or both a hydrogen-containing gas and a fluorine-containing gas to the substrate; and forming plasma from the second processing gas using a radio frequency and etching the silicon-containing film.

12 Claims, 12 Drawing Sheets

(52) U.S. Cl.
CPC .. *H01J 37/32568* (2013.01); *H01J 37/32724* (2013.01); *H01L 21/31144* (2013.01); *H01L 21/32137* (2013.01); *H01L 21/32139* (2013.01); *H01J 37/3211* (2013.01); *H01J 2237/002* (2013.01); *H01J 2237/334* (2013.01)

(58) Field of Classification Search
CPC ........... H01J 2237/002; H01J 2237/334; H01J 37/321; H01J 37/32715; H01J 37/32743; H01L 21/31116; H01L 21/31144; H01L 21/32137; H01L 21/32139; H01L 21/67069; H01L 21/67103
USPC ....................................................... 216/71
See application file for complete search history.

(56) References Cited

FOREIGN PATENT DOCUMENTS

| | | |
|---|---|---|
| JP | 2019179889 A | 10/2019 |
| JP | 2020-136669 A | 8/2020 |
| JP | 2020-205361 A | 12/2020 |

* cited by examiner

[FIG.1]
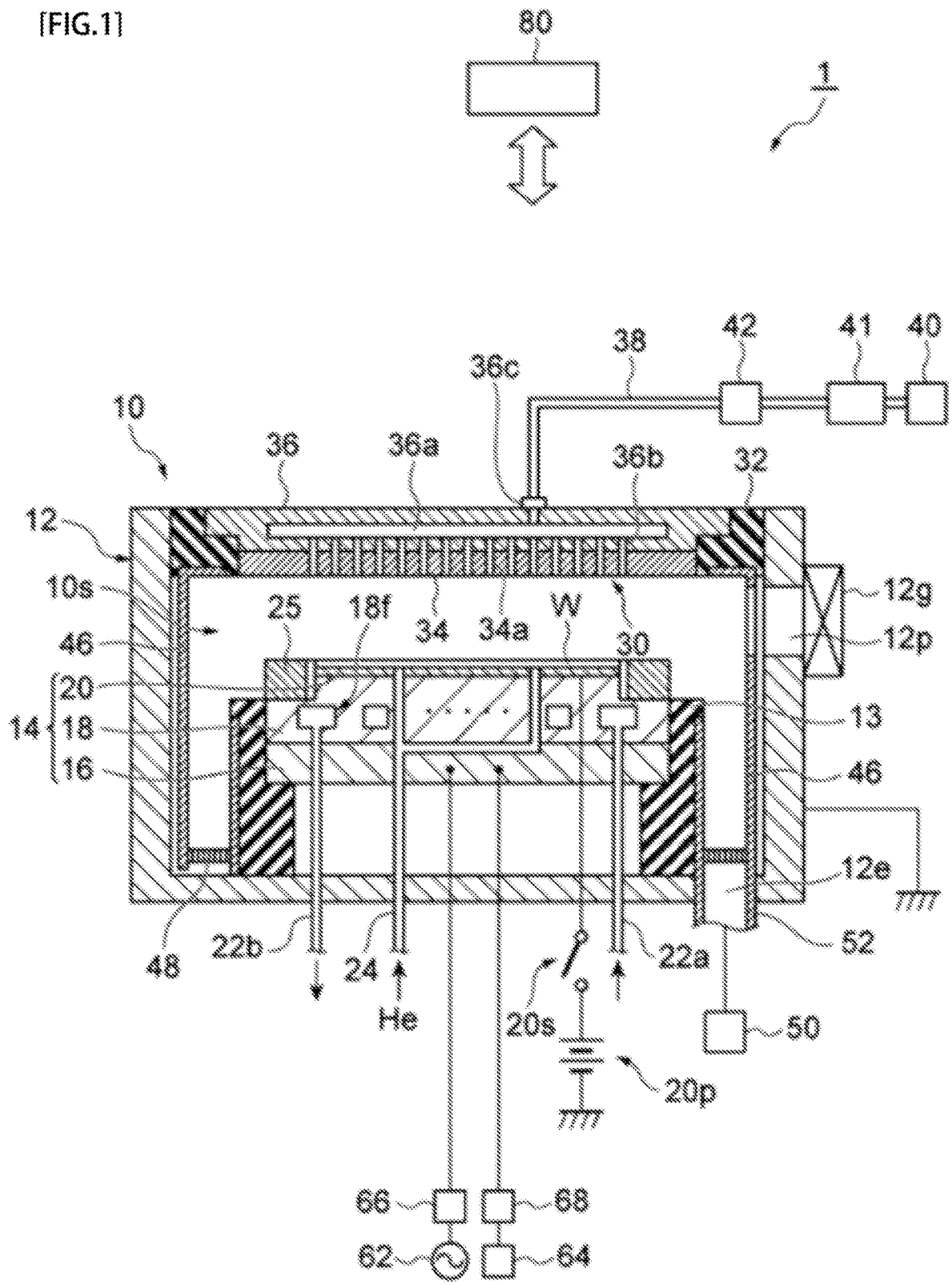

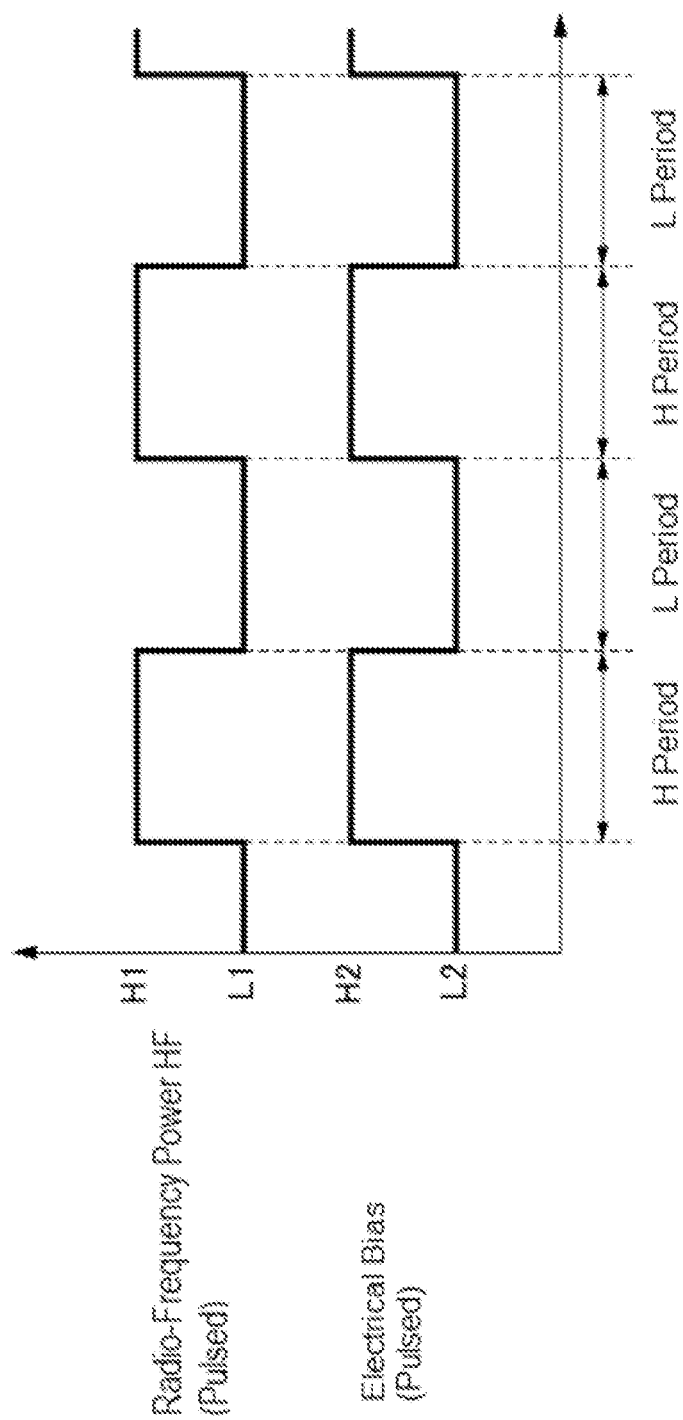
[FIG. 2]

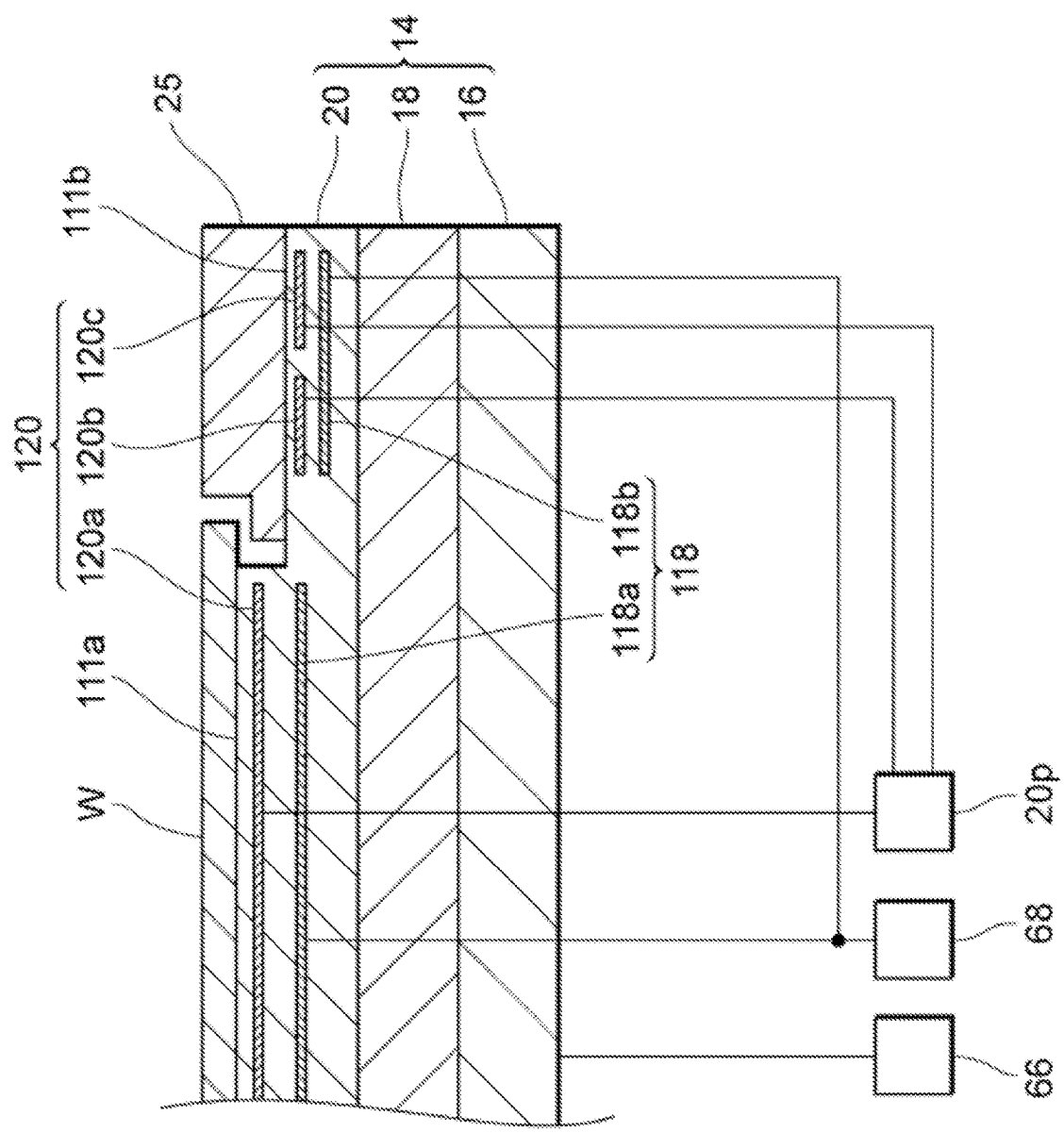
[FIG. 3]

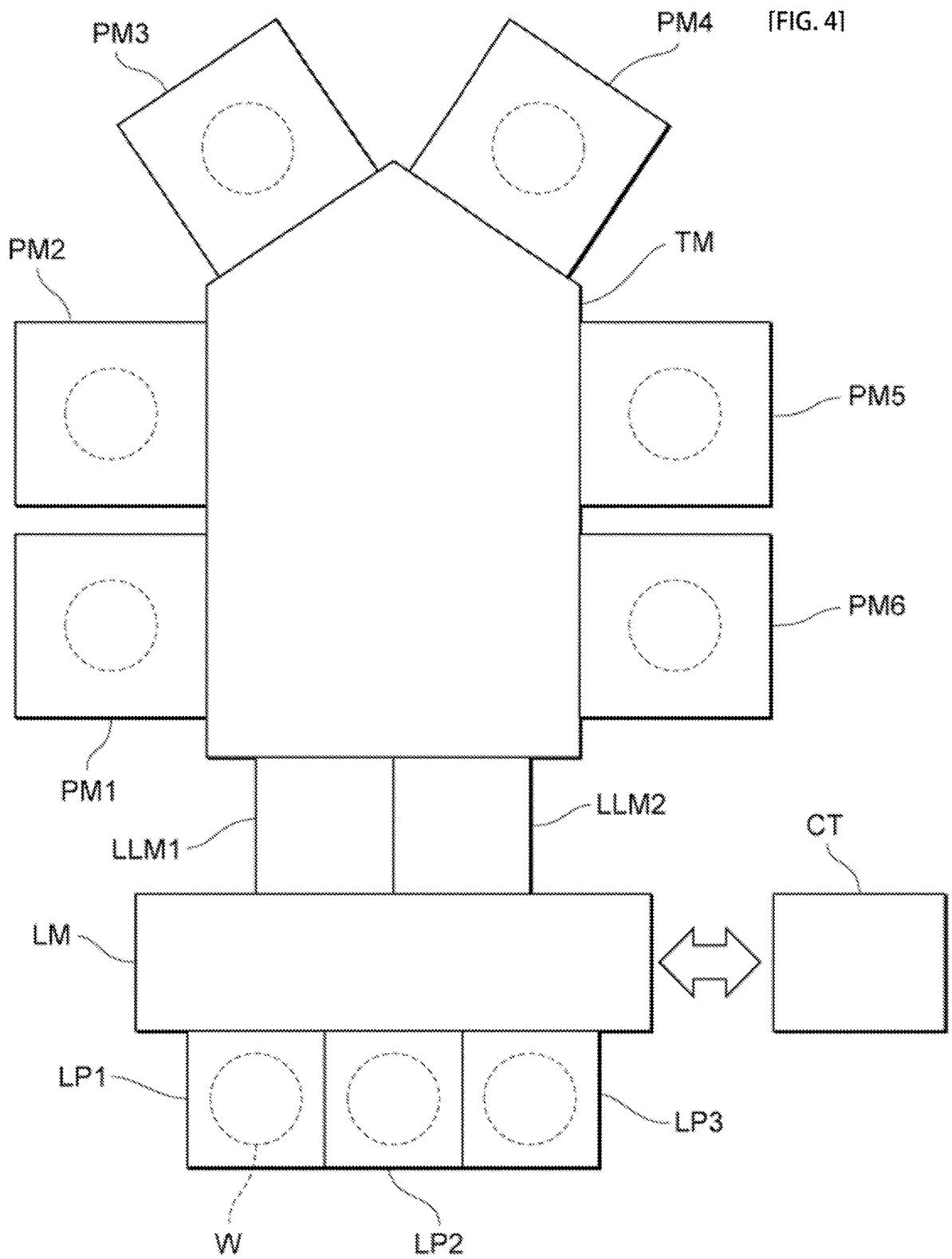

[FIG. 5]
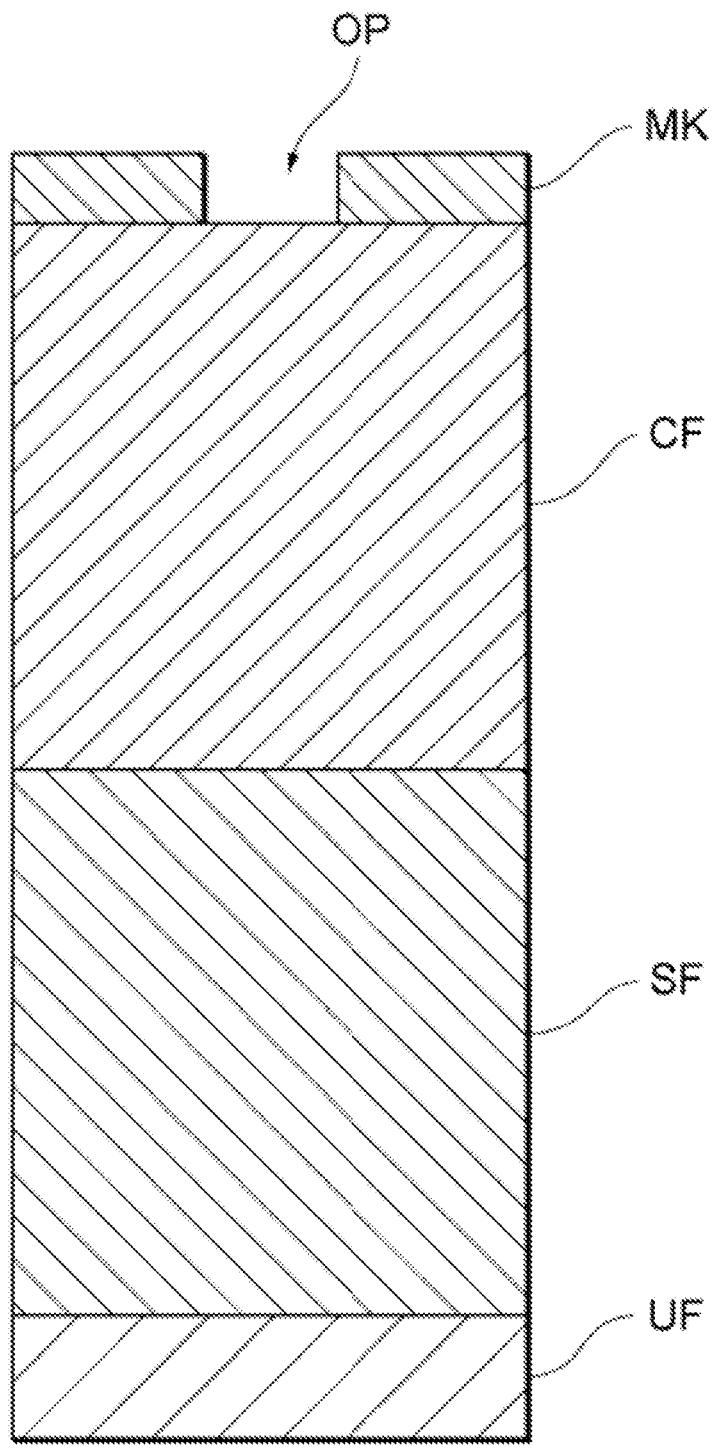

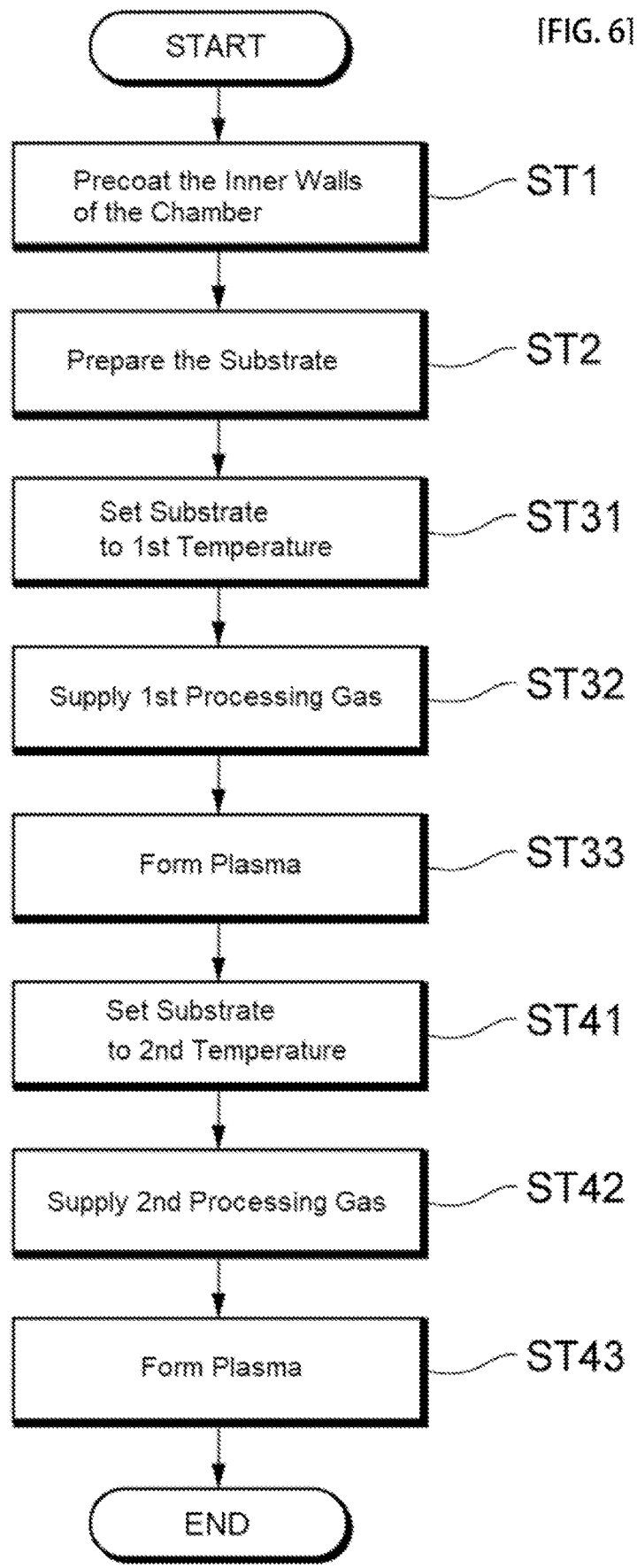
[FIG. 6]

[FIG. 7]
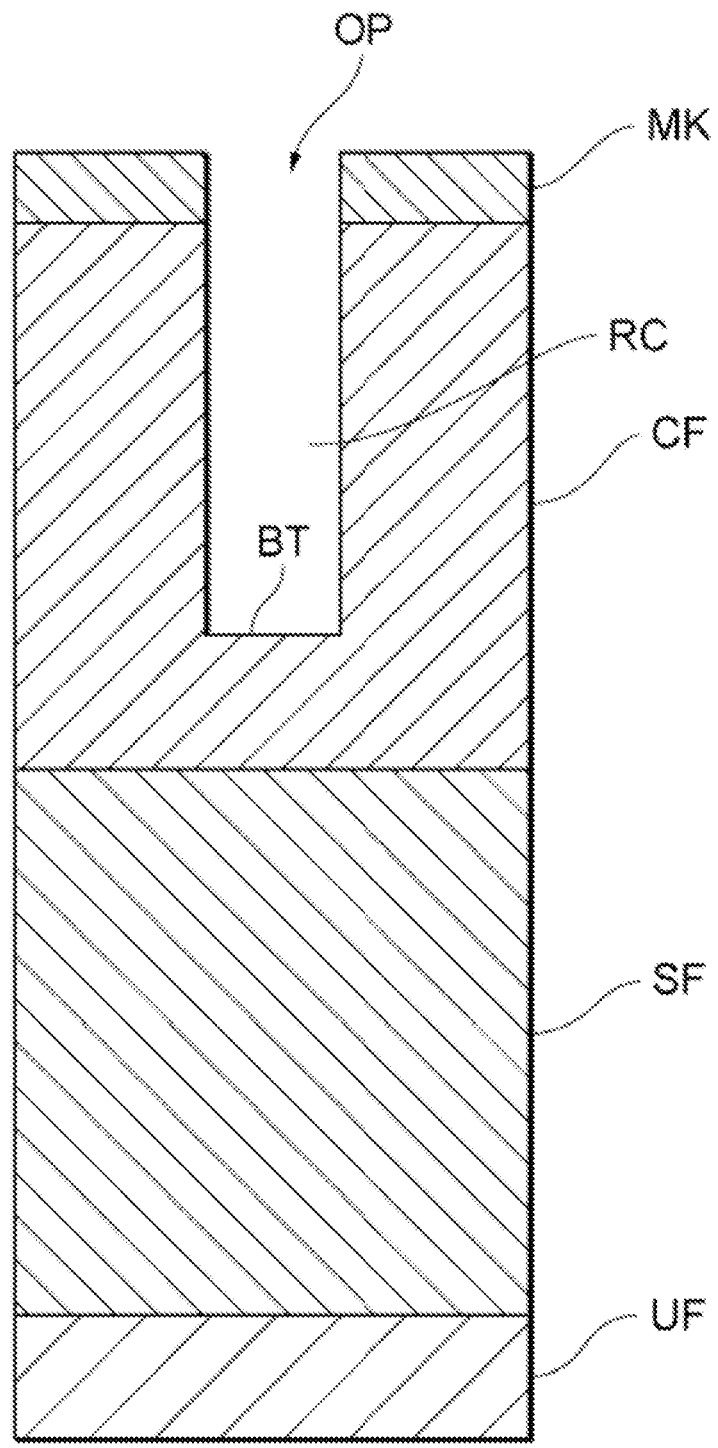

[FIG. 8]
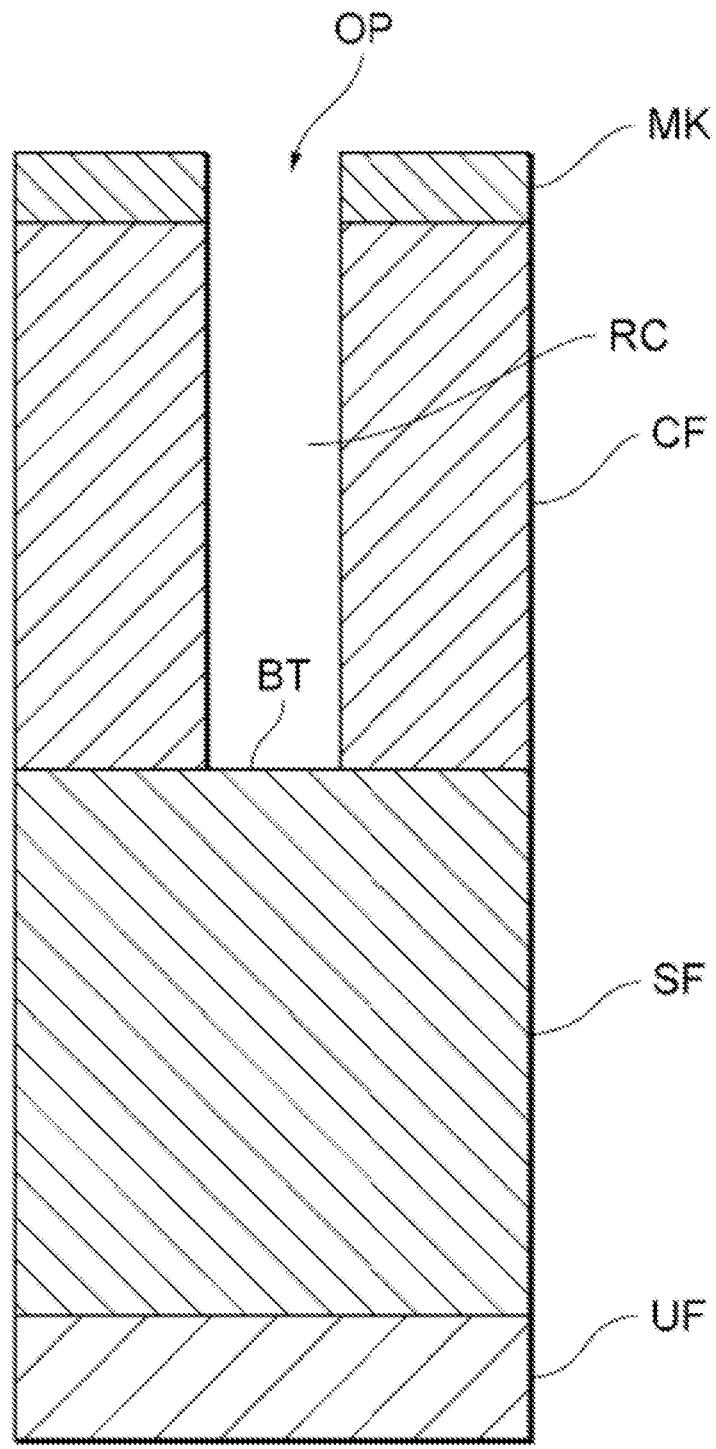

[FIG. 9]
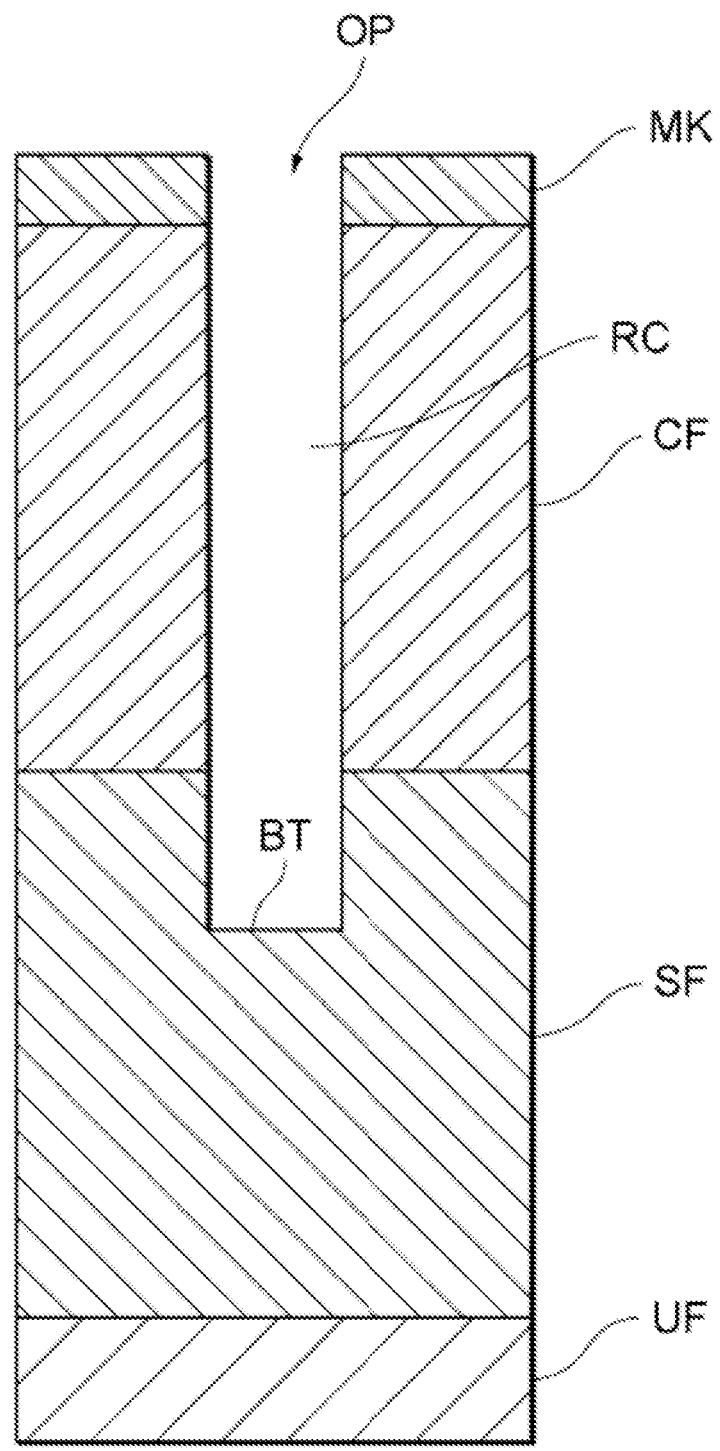

[FIG. 10]
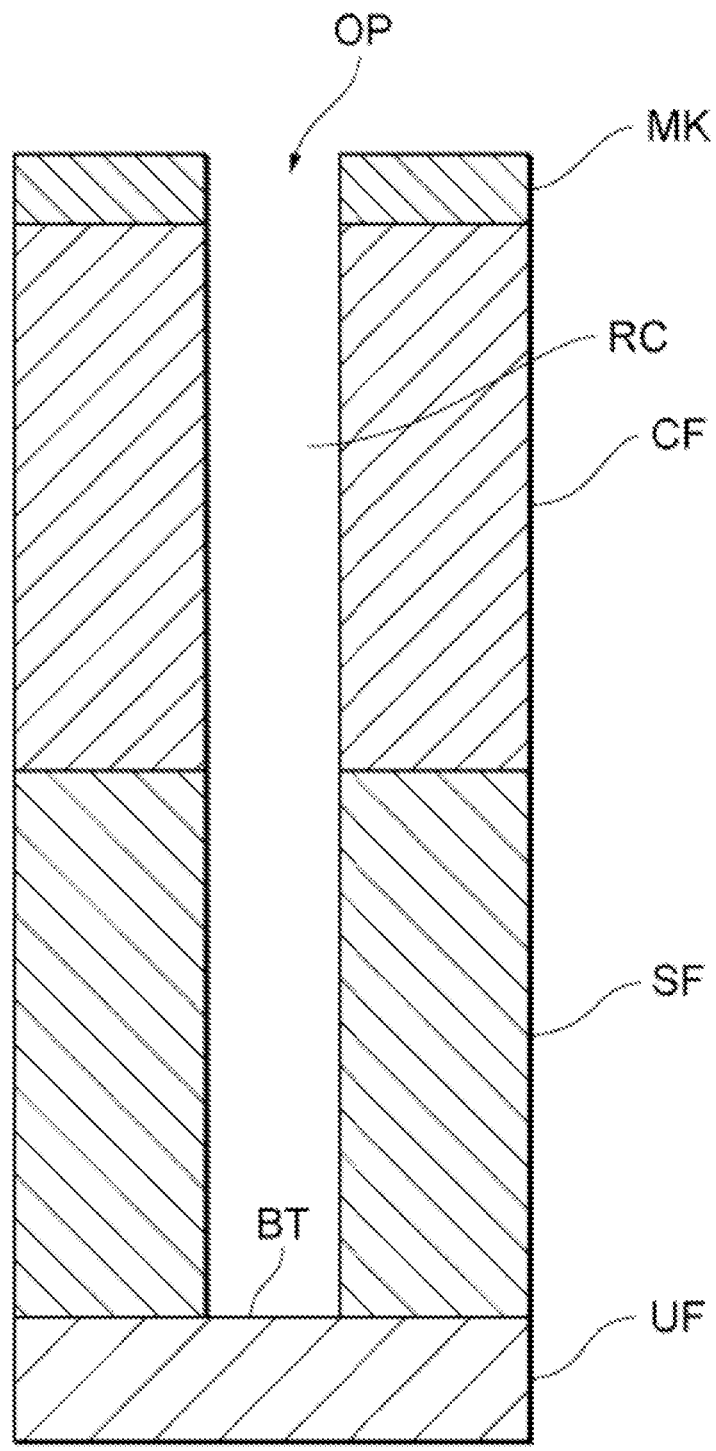

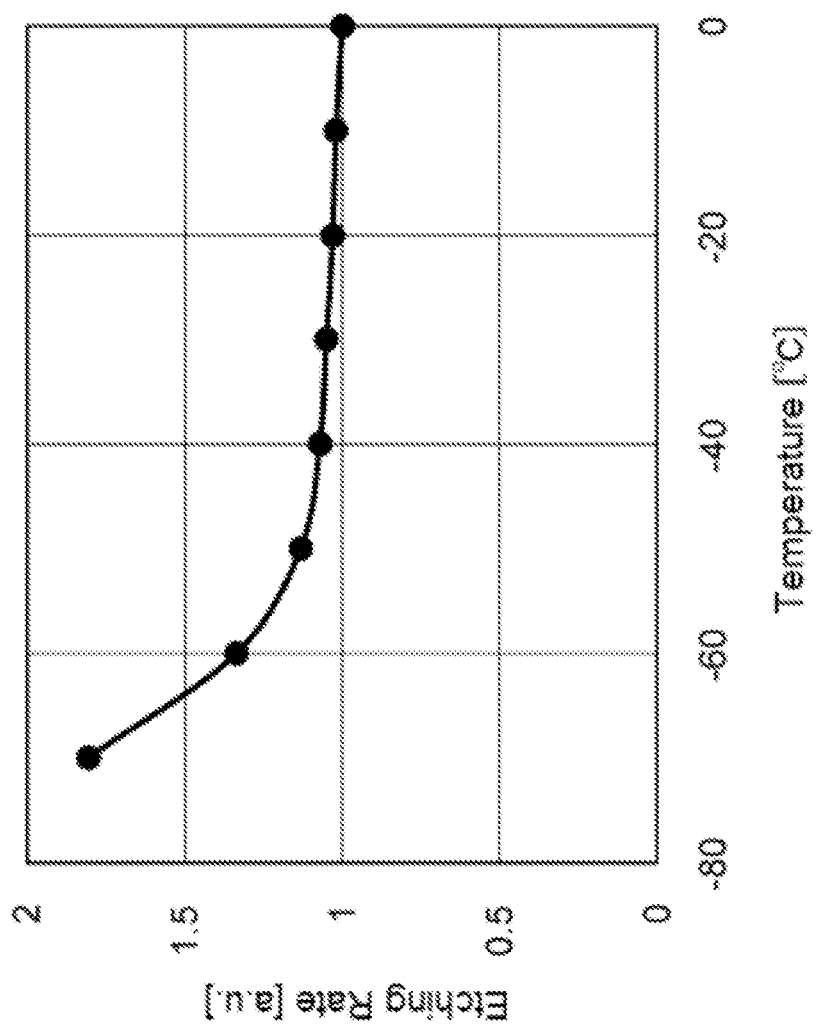
[FIG. 11]

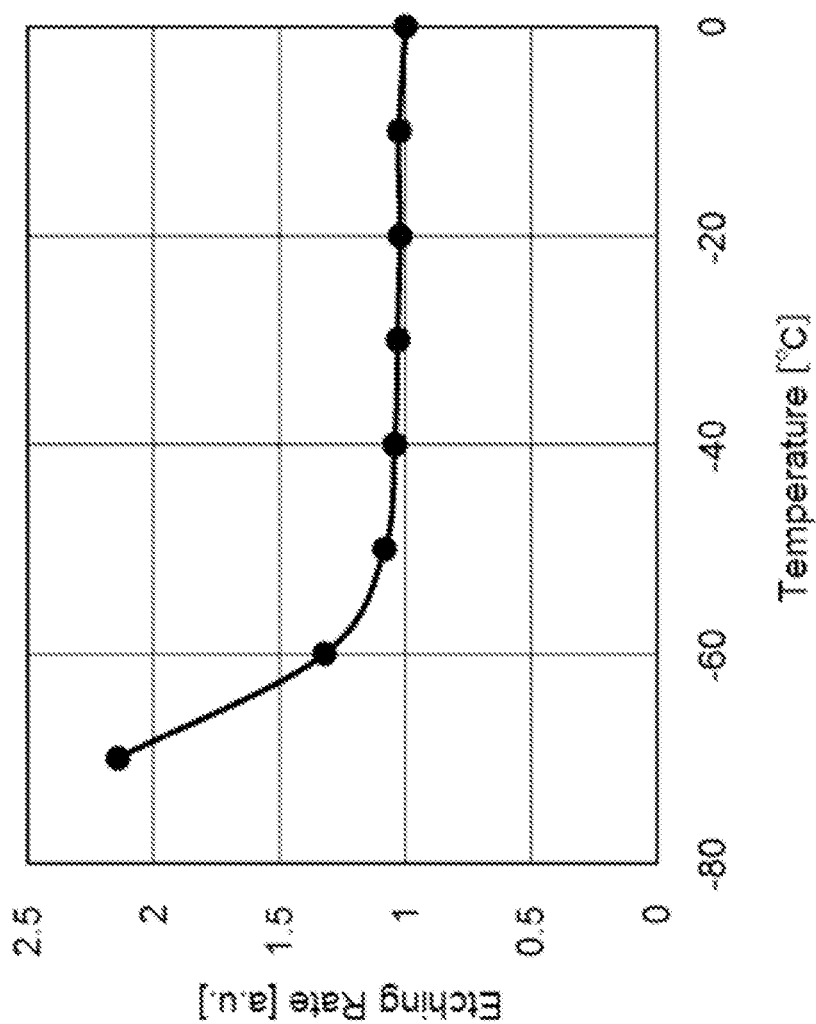
[FIG. 12]

PLASMA PROCESSING METHOD AND PLASMA PROCESSING APPARATUS

CROSS-REFERENCE TO RELATED APPLICATION

This application claims priority to Japanese Patent Application Nos. 2021-123428 filed on Jul. 28, 2021 and 2022-102519 filed on Jun. 27, 2022, the entire contents of which are hereby incorporated by reference.

TECHNICAL FIELD

An exemplary embodiment of the present disclosure relates to a plasma processing method and a plasma processing apparatus.

BACKGROUND

JP 2019-179889A discloses a processing method for reducing bowing during etching.

SUMMARY

The plasma processing method according to an exemplary embodiment of the present disclosure is performed in a plasma processing apparatus. The plasma processing method comprises preparing a substrate including a silicon-containing film and a carbon-containing film formed on the silicon-containing film; setting a temperature of the substrate to a first temperature of 0° C. or less; supplying $H_2O$ to the substrate using a first processing gas comprising at least one of (a) gas comprising hydrogen atoms and oxygen atoms, and (b) a first gas comprising hydrogen atoms and a second gas comprising oxygen atoms; generating plasma from the first processing gas using a radio frequency and etching the carbon-containing film; setting the temperature of the substrate to a second temperature different from the first temperature; supplying a second processing gas containing a hydrogen- and fluorine-containing gas or both a hydrogen-containing gas and a fluorine-containing gas to the substrate; and generating plasma from the second processing gas using a radio frequency and etching the silicon-containing film.

BRIEF DESCRIPTION OF THE DRAWINGS

FIG. 1 is a figure schematically illustrating the plasma processing apparatus 1 in an exemplary embodiment of the present disclosure.

FIG. 2 is a timing chart showing an example of radio frequency power HF and the electrical bias.

FIG. 3 is a partially enlarged view of another example of a substrate support 14 in the plasma processing apparatus 1.

FIG. 4 is a figure schematically illustrating a substrate processing system PS in an exemplary embodiment of the present disclosure.

FIG. 5 is a figure showing the cross-sectional structure of a substrate W.

FIG. 6 is a flowchart showing an example of the processing method.

FIG. 7 is a figure showing the cross-sectional structure of the substrate W during step ST3.

FIG. 8 is a figure showing the cross-sectional structure of the substrate W after step ST3.

FIG. 9 is a figure showing the cross-sectional structure of the substrate W during step ST4.

FIG. 10 is a figure showing the cross-sectional structure of the substrate W after step ST4.

FIG. 11 is a graph showing the measurement results from Test 1.

FIG. 12 is a graph showing the measurement results from Test 2.

DETAILED DESCRIPTION

Embodiments of the present disclosure will now be described.

An exemplary embodiment of the present disclosure provides a plasma processing method. This plasma processing method is a plasma processing method performed in a plasma processing apparatus, the plasma processing method comprising: preparing a substrate including a silicon-containing film and a carbon-containing film formed on the silicon-containing film; setting a temperature of the substrate to a first temperature of 0° C. or less; supplying $H_2O$ to the substrate using a first processing gas comprising at least one of (a) gas comprising hydrogen atoms and oxygen atoms, and (b) a first gas comprising hydrogen atoms and a second gas comprising oxygen atoms; generating plasma from the first processing gas using a radio frequency and etching the carbon-containing film; setting the temperature of the substrate to a second temperature different from the first temperature; supplying a second processing gas containing a hydrogen- and fluorine-containing gas or both a hydrogen-containing gas and a fluorine-containing gas to the substrate; and generating plasma from the second processing gas using a radio frequency and etching the silicon-containing film.

In an exemplary embodiment, the plasma processing apparatus includes a plasma processing chamber, a substrate support disposed in the plasma processing chamber to support a substrate, and an upper electrode disposed in the plasma processing chamber opposite the substrate support, wherein the preparing a substrate includes placing the substrate on the substrate support, wherein the etching the carbon-containing film including supplying a radio frequency to the substrate support or to the upper electrode to form plasma from the first processing gas in the plasma processing chamber to etch the carbon-containing film, and wherein the etching the silicon-containing film including supplying a radio frequency to the substrate support or to the upper electrode to form plasma from the second processing gas in the plasma processing chamber to etch the silicon-containing film.

In an exemplary embodiment, the plasma processing apparatus includes a first plasma processing chamber and a second plasma processing chamber, a first substrate support disposed in the first plasma processing chamber to support a substrate, a first upper electrode disposed in the first plasma processing chamber opposite the first substrate support, a second substrate support disposed in the second plasma processing chamber to support a substrate, and a second upper electrode disposed in the second plasma processing chamber opposite the second substrate support, wherein the preparing a substrate includes placing the substrate on the first substrate support, wherein the etching the carbon-containing film includes supplying a radio frequency to the first substrate support or to the first upper electrode to form plasma from the first processing gas in the plasma processing chamber to etch the carbon-containing film, wherein the plasma processing method further comprises transferring the substrate from the first substrate support to the second substrate support, wherein the setting the temperature of the substrate to a second temperature different from the first temperature includes setting the temperature of the substrate to the second temperature in the second substrate support, and wherein the etching the silicon-containing film includes supplying a radio frequency to the second substrate support or to the second upper electrode to form plasma from the second processing gas in the plasma processing chamber to etch the silicon-containing film.

In an exemplary embodiment, the plasma processing apparatus includes a transfer chamber connected to the first plasma processing chamber and the second plasma processing chamber, the pressure in the transfer chamber is lower than atmospheric pressure, and the transferring the substrate, the substrate is transferred from the first substrate support to the second substrate support via the transfer chamber.

In an exemplary embodiment, the second temperature is lower than the first temperature.

In an exemplary embodiment, the second temperature is higher than the first temperature.

In an exemplary embodiment, the carbon-containing film is an amorphous carbon film.

In an exemplary embodiment, the oxygen atoms comprise $O_2$.

In an exemplary embodiment, wherein the hydrogen atoms comprise $H_2$.

In an exemplary embodiment, the gas comprises $H_2O$.

In an exemplary embodiment, the setting the temperature of the substrate to the first temperature of 0° C. or less comprises setting the temperature of the substrate or a substrate support of the substrate to the first temperature.

An exemplary embodiment of the present disclosure provides a plasma processing method. This plasma processing method is a plasma processing method performed in a plasma processing apparatus having a plasma processing chamber. The plasma processing method comprises: supplying a carbon-containing gas to the plasma processing chamber; generating plasma from the carbon-containing gas using a radio frequency to form a protective film on at least a portion of inner walls of the plasma processing chamber; preparing a substrate including silicon-containing film and a carbon-containing film formed on the silicon-containing film in the plasma processing chamber; supplying a first processing gas to the plasma processing chamber, the first processing gas comprising at least one of (a) gas comprising hydrogen atoms and oxygen atoms, and (b) a first gas comprising hydrogen atoms and a second gas comprising oxygen atoms, and supplying $H_2O$ to the substrate; generating plasma from the first processing gas using a radio frequency to etch the carbon-containing film; supplying a second processing gas including a hydrogen- and fluorine-containing gas or a second processing gas including a hydrogen-containing gas and a fluorine-containing gas to the prepared substrate in the plasma processing chamber; and supplying a radio frequency to form plasma from the second processing gas and etch the silicon-containing film.

An exemplary embodiment of the present disclosure further comprises: setting a temperature of the substrate to a first temperature; and setting the temperature of the substrate to a second temperature different from the first temperature, wherein the etching the carbon-containing film, the carbon-containing film is etched after the substrate has been set to the first temperature, and the etching the silicon-containing film, the silicon-containing film is etched after the substrate has been set to the second temperature.

In an exemplary embodiment, the protective film is a carbon-containing film.

In an exemplary embodiment, the plasma processing apparatus is a capacitive coupling-type plasma processing apparatus.

In an exemplary embodiment, the oxygen atoms comprise $O_2$, the hydrogen atoms comprise $H_2$, and wherein the gas comprises $H_2O$.

An exemplary embodiment of the present disclosure provides a plasma processing method. The plasma processing apparatus comprises: at least one plasma processing chamber; a temperature controller that sets the temperature of the substrate in the at least one plasma processing chamber; a gas supply configured to supply gas to the at least one plasma processing chamber; a plasma forming unit configured to form plasma from the gas in the at least one plasma processing chamber; and a controller configured to control the temperature controller, the gas supply, and the plasma forming unit, wherein the controller executes controls to set the temperature of a substrate including a silicon-containing film and a carbon-containing film formed on the silicon-containing film to a first temperature of 0° C. or less, supply $H_2O$ to the substrate using a first processing gas comprising at least one of (a) gas comprising hydrogen atoms and oxygen atoms, and (b) a first gas comprising hydrogen atoms and a second gas comprising oxygen atoms; form plasma from the first processing gas using a radio frequency and etching the carbon-containing film; set the temperature of the substrate to a second temperature different from the first temperature; supply a second processing gas containing a hydrogen- and fluorine-containing gas or both a hydrogen-containing gas and a fluorine-containing gas to the substrate; and form plasma from the second processing gas using a radio frequency and etching the silicon-containing film.

In an exemplary embodiment, for the temperature of the substrate being set to the first temperature of 0° C. or less, the temperature of the substrate or a substrate support of the substrate is set to the first temperature.

An exemplary embodiment of the present disclosure provides a plasma processing system. The plasma processing system includes: a first plasma processing apparatus having a first plasma processing chamber and a second plasma processing apparatus having a second plasma processing chamber, the plasma processing system comprising: a temperature controller that sets the temperature of a substrate arranged in the first plasma processing chamber and the second plasma processing chamber; a gas supply configured to supply gas to the first plasma processing chamber and the second plasma processing chamber; an inductively coupled plasma forming unit coupled to the first plasma processing chamber; a capacitively coupled plasma forming unit coupled to the second plasma processing chamber; and a controller configured to control the temperature controller, the gas supply, the inductively coupled plasma forming unit, and the capacitively coupled plasma forming unit, wherein the controller executes controls to place a substrate including a silicon-containing film and a carbon-containing film formed on the silicon-containing film in the first plasma processing chamber, set the temperature of the substrate to a first temperature that is 0° C. or less; supply $H_2O$ to the substrate using a first processing gas comprising at least one of (a) gas comprising hydrogen atoms and oxygen atoms, and (b) a first gas comprising hydrogen atoms and a second gas comprising oxygen atoms; generate plasma from the first processing gas using a radio frequency to etch the carbon-containing film; place the substrate with the etched carbon-containing film in the second plasma processing chamber; set the temperature of the substrate to a second temperature that is different from the first temperature; supply a second processing gas including a hydrogen- and fluorine-containing gas or both a hydrogen-containing gas and a fluorine-containing gas to the substrate; and generate plasma from the second processing gas using a radio frequency to etch the silicon-containing film.

In an exemplary embodiment, for the temperature of the substrate being set to the first temperature of 0° C. or less, the temperature of the substrate or a substrate support of the substrate is set to the first temperature.

The following is a detailed description of embodiments of the present disclosure with reference to the drawings. In the drawings, identical or similar elements are denoted by the same reference numbers and redundant descriptions of these elements has been omitted.

In the following description, positional relationships such as up, down, left and right are based on the positional relationships shown in the drawings except where otherwise specified. The dimensional ratios in the drawings do not indicate actual ratios, and the actual ratios are not limited to the ratios shown in the drawings.

<Configuration of the Plasma Processing Apparatus 1>

FIG. 1 is a figure schematically illustrating the plasma processing apparatus 1 in an exemplary embodiment of the present disclosure. The plasma processing apparatus 1 is a capacitively coupled plasma processing apparatus. The plasma processing method in an exemplary embodiment in the present disclosure ("the processing method" below) may be performed using the plasma processing apparatus 1.

The plasma processing apparatus 1 in FIG. 1 includes a chamber 10. The chamber 10 has an inner space 10s. The chamber 10 includes chamber body 12. The chamber body 12 has a substantially cylindrical shape. The chamber body 12 can be made of, for example, aluminum. A corrosion resistant film is disposed on the inner wall surfaces of the chamber body 12. The corrosion resistant film can be made of a ceramic such as aluminum oxide or yttrium oxide.

A passage 12p is formed in a side wall of the chamber body 12. The substrate W is transferred between the inner space 10s and the chamber 10 exterior via the passage 12p. The passage 12p is opened and closed by a gate valve 12g. The gate valve 12g is provided along a side wall of the chamber body 12.

A support unit 13 is disposed on the bottom of the chamber body 12. The support unit 13 is made of an insulating material. The support unit 13 has a substantially cylindrical shape. The support unit 13 extends upward from the bottom of the chamber body 12 into the inner space 10s. The support unit 13 supports a substrate support 14. The substrate support 14 is configured to support a substrate W in the inner space 10s.

The substrate support 14 has a lower electrode 18 and an electrostatic chuck 20. The substrate support 14 may also include an electrode plate 16. The electrode plate 16 is made of a conductive material such as aluminum and has a substantially disk shape. The lower electrode 18 is disposed on the electrode plate 16. The lower electrode 18 is made of a conductive material such as aluminum and has a substantially disk shape. The lower electrode 18 is electrically connected to the electrode plate 16.

The electrostatic chuck 20 is disposed on the lower electrode 18. The substrate W is placed on the upper surface of the electrostatic chuck 20. The electrostatic chuck 20 has a main body and electrodes. The main body of the electrostatic chuck 20 has a substantially disk shape and is made of a dielectric material. The electrodes of the electrostatic chuck 20 are film-shaped electrodes and are disposed in the main body of the electrostatic chuck 20. The electrodes of the electrostatic chuck 20 are connected to a direct current power supply 20p via a switch 20s. When a voltage from the direct current power supply 20p is applied to the electrodes of the electrostatic chuck 20, an electrostatic attractive force is formed between the electrostatic chuck 20 and the substrate W. The substrate W is attracted to the electrostatic chuck 20 by electrostatic attraction and is held in place by the electrostatic chuck 20.

An edge ring 25 is arranged on the substrate support 14. The edge ring 25 is a ring-shaped member. The edge ring 25 can be made of silicon, silicon carbide, or quartz. The substrate W is arranged on the electrostatic chuck 20 in the region surrounded by the edge ring 25.

A flow path 18f is disposed in the lower electrode 18. A heat exchange medium (such as a refrigerant) is supplied to the flow path 18f from a chiller unit disposed outside the chamber 10 via a pipe 22a. The heat exchange medium supplied to the flow path 18f is returned to the chiller unit via the pipe 22b. In the plasma processing apparatus 1, the temperature of the substrate W placed on the electrostatic chuck 20 is adjusted by a exchange of heat between the heat exchange medium and the lower electrode 18.

The plasma processing apparatus 1 is disposed with a gas supply line 24. The gas supply line 24 supplies heat transfer gas (such as He gas) from the heat transfer gas supply mechanism to a gap between the upper surface of the electrostatic chuck 20 and the back surface of the substrate W.

The plasma processing apparatus 1 also includes an upper electrode 30. The upper electrode 30 is disposed above the substrate support 14. The upper electrode 30 is supported in the upper portion of the chamber body 12 via a member 32. The member 32 is made of an insulating material. The upper electrode 30 and the member 32 close the upper opening in the chamber body 12.

The upper electrode 30 may include a top plate 34 and a support 36. The lower surface of the top plate 34 is on the side of the inner space 10s and defines the inner space 10s. The top plate 34 can be made of a low resistance conductive material or semiconducting material that generates less Joule heat. The top plate 34 has a plurality of gas discharge holes 34a that pass through the top plate 34 in the thickness direction of the plate.

The support 36 detachably supports the top plate 34. The support 36 is made of a conductive material such as aluminum. A gas diffusion chamber 36a is disposed in the support 36. The support 36 has a plurality of gas holes 36b extending downward from the gas diffusion chamber 36a. The plurality of gas holes 36b communicate with the plurality of gas discharge holes 34a. A gas inlet 36c is formed on the support 36. The gas inlet 36c is connected to the gas diffusion chamber 36a. A gas supply pipe 38 is connected to the gas inlet 36c.

A gas source group 40 is connected to the gas supply pipe 38 via a flow rate controller group 41 and a valve group 42. The flow rate controller group 41 and the valve group 42 constitute a gas supply unit. The gas supply unit may also include the gas source group 40. The gas source group 40 includes a plurality of gas sources. The plurality of gas sources include the sources of the processing gases used in the processing method. The flow rate controller group 41 includes a plurality of flow rate controllers. Each of the plurality of flow rate controllers in the flow rate controller group 41 is a mass flow controller or a pressure control-type flow rate controller. The valve group 42 includes a plurality of on-off valves. Each of the plurality of gas sources in the gas source group 40 is connected to the gas supply pipe 38 via the corresponding flow rate controller in the flow rate controller group 41 and the corresponding on-off valve in the valve group 42.

In the plasma processing apparatus 1, a shield 46 is detachably disposed along an inner wall surface of the chamber body 12 and the outer periphery of the support unit 13. The shield 46 keeps reaction by-products from adhering to the chamber body 12. The shield 46 can be configured, for example, by forming a corrosion-resistant film on the surface of a base material made of aluminum. The corrosion resistant film can be made of a ceramic such as yttrium oxide.

A baffle plate 48 is disposed between the support unit 13 and a side wall of the chamber body 12. The baffle plate 48 can be configured, for example, by forming a corrosion-resistant film (a film such as yttrium oxide) on the surface of a member made of aluminum. The baffle plate 48 is formed with a plurality of through holes. An exhaust port 12e is disposed below the baffle plate 48 at the bottom of the chamber body 12. An exhaust apparatus 50 is connected to an exhaust port 12e via an exhaust pipe 52. The exhaust apparatus 50 includes a pressure regulating valve and a vacuum pump such as a turbo molecular pump.

The plasma processing apparatus 1 includes a radio frequency power supply 62 and a bias power supply 64. The radio frequency power supply 62 is a power supply that generates radio frequency power HF. The radio frequency power HF has a first frequency suitable for generating plasma. The first frequency can be, for example, a frequency in the range of 27 MHz to 100 MHz. The radio frequency power supply 62 is connected to the lower electrode 18 via the matching unit 66 and the electrode plate 16. The matching unit 66 has a circuit for matching the impedance on the load side (lower electrode 18 side) of the radio frequency power supply 62 with the output impedance of the radio frequency power supply 62. The radio frequency power supply 62 may be connected to the upper electrode 30 via the matching unit 66. The radio frequency power supply 62 constitutes an example of a plasma forming unit.

The bias power supply 64 is a power supply that generates an electrical bias. The bias power supply 64 is electrically connected to the lower electrode 18. The electrical bias has a second frequency. The second frequency is lower than the first frequency. The second frequency can be, for example, a frequency in the range of 400 kHz to 13.56 MHz. The electrical bias is applied to the substrate support 14 to attract ions to the substrate W when used with the radio frequency power HF. In one example, an electrical bias is applied to the lower electrode 18. When an electrical bias is applied to the lower electrode 18, the potential of the substrate W mounted on the substrate support 14 fluctuates within a cycle defined by the second frequency. The electrical bias may be applied to a bias electrode (in one example, the bias electrode 118 in FIG. 3) disposed in the electrostatic chuck 20.

In one embodiment, the electrical bias may be radio frequency power LF with a second frequency. Radio frequency power LF is used as radio frequency bias power for attracting ions to the substrate W when used with radio frequency power HF. The bias power supply 64 configured to generate radio frequency power LF is connected to the lower electrode 18 via the matching unit 68 and the electrode plate 16. The matching unit 68 has a circuit for matching the impedance on the load side (lower electrode 18 side) of the bias power supply 64 with the output impedance of the bias power supply 64.

It should be noted that the plasma may be formed using radio frequency power LF without radio frequency power HF, that is, using only a single type of radio frequency power. In this case, the frequency of the radio frequency power LF may be a frequency higher than 13.56 $MH_2$, such as 40 MHz. In this case, the plasma processing apparatus 1 also does not have to include the radio frequency power supply 62 and the matching unit 66. In this case, the bias power supply 64 constitutes one example of a plasma forming unit.

In another embodiment, the electrical bias may be pulsed voltage (pulse voltage). In this case, the bias power supply may be a direct current power supply. The bias power supply may be configured so that the power supply itself supplies pulse voltage, or may be configured to include a device that pulses the voltage downstream from the bias power supply. In one example, pulse voltage is applied to the lower electrode 18 so that a negative potential is generated on the substrate W. The waveform of one or more of the pulse voltages in each pulse of electrical bias may be a square wave, a triangular wave, an impulse, or some other waveform.

The cycle of the pulse voltage is defined by the second frequency. The cycle of the pulse voltage includes two periods. The pulse voltage in one of the two periods is negative voltage. The level (absolute value) of the voltage in one of the two periods is higher than the level (absolute value) of the voltage in the other of the two periods. The voltage in the other period may be either negative or positive voltage. The level of the negative voltage in the other period may be greater than zero or may be zero. In this embodiment, the bias power supply 64 is connected to the lower electrode 18 via a low-pass filter and the electrode plate 16. The bias power supply 64 may be connected to a bias electrode (in one example, the bias electrode 118 in FIG. 3) disposed in the electrostatic chuck 20 instead of the lower electrode 18.

In one embodiment, the bias power supply 64 may provide continuous waves of electrical bias to the lower electrode 18. In other words, the bias power supply 64 may continuously apply an electrical bias to the lower electrode 18.

In another embodiment, the bias power supply 64 may apply electrical bias pulse waves to the lower electrode 18. The pulse waves of the electrical bias can be applied to the lower electrode 18 cyclically. The cycle of the electrical bias pulse waves is defined by a third frequency. The third frequency is lower than the second frequency. The third frequency can be, for example, 1 Hz or more and 200 kHz or less. In another example, the third frequency may be 5 Hz or more and 100 kHz or less.

The cycle of the pulse waves of the electrical bias includes two periods, that is, an H period and an L period. The level of electrical bias in the H period (that is, the level of the pulses of electrical bias) is higher than the level of the electrical bias in the L period. In other words, the pulse waves of the electrical bias may be applied to the lower electrode 18 by increasing or decreasing the level of the electrical bias. The level of electrical bias during the L period may be greater than zero. Alternatively, the level of electrical bias during the L period may be zero. In other words, the pulse waves of the electrical bias may be applied to the lower electrode 18 by alternately switching between supplying and not supplying the electrical bias to the lower electrode 18. Here, when the electrical bias is the radio frequency power LF, the level of the electrical bias is the power level of the radio frequency power LF. When the electrical bias is radio frequency power LF, the level of radio frequency power LF in the pulses of the electrical bias may be 2 kW or more. When the electrical bias is composed of pulse waves of negative direct current voltage, the level of the electrical bias is the effective value of the absolute value of the negative direct current voltage. The duty ratio of the electrical bias pulse waves, that is, the ratio of the H period in the periods of the electrical bias pulse waves can be, for example, 1% or more and 80% or less. In another example, the duty ratio of the electrical bias pulse waves may be 5% or more and 50% or less. Alternatively, the duty ratio of the pulse waves of the electrical bias may be 50% or more and 99% or less. Among the periods in which an electrical bias is supplied, the L period corresponds to the first period mentioned above, and the H period corresponds to the second period mentioned above. The level of the electrical bias in the L period corresponds to the 0 or the first level mentioned above, and the level of the electrical bias in the H period corresponds to the second level mentioned above.

In one embodiment, the radio frequency power supply 62 may supply continuous waves of radio frequency power HF. In other words, the radio frequency power supply 62 may continuously supply radio frequency power HF.

In another embodiment, the radio frequency power supply 62 may supply pulse waves of radio frequency power HF. The pulse wave of radio frequency power HF can be supplied cyclically. The period of the pulse waves of radio frequency power HF is defined by a fourth frequency. The fourth frequency is lower than the second frequency. In one embodiment, the fourth frequency is the same as the third frequency. The period of radio frequency power HF pulse waves includes two periods, namely an H period and an L period. In the two periods, the power level of radio frequency power HF in the H period is higher than the power level of radio frequency power HF in the L period. The power level of the radio frequency power HF in the L period may be greater than zero or may be zero. Among the periods in which radio frequency power HF is supplied, the L period corresponds to the third period mentioned above, and the H period corresponds to the fourth period mentioned above. The level of radio frequency power HF in the L period corresponds to 0 or the third level mentioned above, and the level of the electrical bias in the H period corresponds to the fourth level mentioned above.

The cycle of the pulse waves of radio frequency power HF may be synchronized with the cycle of the pulse waves of the electrical bias. The H period in the pulse wave cycles of radio frequency power HF may be synchronized with the H period in the pulse wave cycle of the electrical bias. Alternatively, the H period in the pulse wave periods of radio frequency power HF does not have to be synchronized with the H period in the pulse wave cycle of the electrical bias. The length of the H period in the pulse wave cycles of radio frequency power HF may be the same as or different from the length of the H period in the pulse wave cycle of the electrical bias. Some or all of the H period in the radio frequency power HF pulse wave cycle may overlap with the H period in the electrical bias pulse wave cycle.

FIG. 2 is a timing chart showing an example of radio frequency power HF and the electrical bias. FIG. 2 is an example in which pulse waves are used for both the radio frequency power HF and the electrical bias. In FIG. 2, the horizontal axis denotes time. In FIG. 2, the vertical axis denotes the power level of the radio frequency power HF and the electrical bias. Here, "L1" of the radio frequency power HF denotes that the radio frequency power HF is either not supplied or is lower than the power level indicated by "H1". Also, "L2" of the electrical bias denotes that either no electrical bias is being supplied or is lower than the power level indicated by "H2". When the electrical bias is composed of pulse waves of negative direct current voltage, the level of the electrical bias is the effective value of the absolute value of the negative direct current voltage. The power level of the radio frequency power HF and the power level of the electrical bias in FIG. 2 do not indicate the relative relationship between the two and may have any setting. In the example shown in FIG. 2, the cycle of the radio frequency power HF pulse waves is synchronized with the cycle of the electrical bias pulse waves, and the lengths of the H period and the L period of the pulse waves of the radio frequency power HF and the lengths of the H period and the L period of the pulse waves of the electrical bias are the same.

The description will now be continued with reference to FIG. 1. The plasma processing apparatus 1 also includes a power source 70. The power supply 70 is connected to the upper electrode 30. In one example, the power source 70 may be configured to supply direct current voltage or low frequency power to the upper electrode 30 during plasma processing. For example, the power supply 70 may supply negative direct current voltage to the upper electrode 30 or may cyclically supply low frequency power. The direct current voltage or low frequency power may be supplied as pulse waves or continuous waves. In this embodiment, positive ions in the inner space 10s are attracted to and collide with the upper electrode 30. As a result, secondary electrons are released from the upper electrode 30. The released secondary electrons modify the mask film MK and improve the etching resistance of the mask film MK. The secondary electrons also contribute to the improving the plasma density. Also, because the charged state of the substrate W is neutralized by exposure to the secondary electrons, the straightness of ions reaching the recesses formed by etching is improved. When the upper electrode 30 is made of a silicon-containing material, silicon is released together with secondary electrons due to collisions with positive ions. The released silicon combines with oxygen in the plasma and is deposited on the mask as a silicon oxide compound that functions as a protective film. Therefore, the supply of direct current voltage or low frequency power to the upper electrode 30, improves the selection ratio, and also suppresses shape abnormalities in the recesses formed by the etching, thereby improving the etching rate.

When plasma processing is performed in the plasma processing apparatus 1, gas is supplied from the gas supply unit to the inner space 10s. Also, a radio frequency electric field is generated between the upper electrode 30 and the lower electrode 18 by the supply of radio frequency power HF and/or an electrical bias. The radio frequency electric field generates plasma from the gas in the inner space 10s.

The plasma processing apparatus 1 may also include a controller 80. The controller 80 may be a computer including a processor, a storage unit such as memory, an input device, a display device, and a signal input/output interface. The controller 80 controls each unit in the plasma processing apparatus 1. With the controller 80, the operator can use the input device to issue command operations to manage the plasma processing apparatus 1. The controller 80 can also display the operating status of the plasma processing apparatus 1 on the display device. A control program and recipe data are stored in the storage unit. The control program is executed by the processor in order to perform various processes in the plasma processing apparatus 1. The processor executes the control program to control each component in the plasma processing apparatus 1 according to the recipe data. In one exemplary embodiment, some or all of the controller 80 may be provided as part of the configuration of a device external to the plasma processing apparatus 1.

FIG. 3 is a partially enlarged view of another example of a substrate support 14 in the plasma processing apparatus 1. The substrate support 14 includes an electrode plate 16, a lower electrode 18, and an electrostatic chuck 20. The upper surface of the electrostatic chuck 20 has a substrate support surface 111a which is the central region supporting the substrate W and an annular region 111b for supporting an edge ring 25. The annular region 111b surrounds the substrate support surface 111a. The substrate W is arranged on the substrate support surface 111a, and the edge ring 25 is arranged in the annular region 111b so as to surround the substrate W on the substrate support surface 111a. The electrostatic chuck 20 is arranged on the lower electrode 18. The upper surface of the electrostatic chuck 20 has a substrate support surface that supports the substrate W.

The electrostatic chuck 20 contains a chuck electrode 120 and bias electrodes 118. The chuck electrode 120 has an electrode 120a disposed between the substrate support surface 111a and the lower electrode 18. The electrode 120a may be a planar electrode conforming to the shape of the substrate support surface 111a. The chuck electrode 120 may also have electrodes 120b, 120c disposed between the edge ring 25 and the lower electrode 18. The electrodes 120b, 120c may be annular electrodes conforming to the shape of the ring assembly 112. Electrode 120c is disposed to the outside of electrode 120b. The electrodes 120b, 120c may form a bipolar electrostatic chuck. The electrodes 120a, 120b, 120c may also be configured integrally. The direct current power supply 20p may be configured to apply the same or different direct current voltages to the electrodes 120a, 120b, 120c.

The bias electrodes 118 has an electrode 118a disposed between the electrode 120a (or the substrate support surface 111a) and the lower electrode 18. The electrode 118a may be a planar electrode conforming to the shape of the substrate support surface 111a, and/or the electrode 120a. The bias electrodes 118 may also have an electrode 118b disposed between the edge ring 25 and the lower electrode 18. Also, Although not shown in the figures, the substrate support 14 may include an electrostatic chuck 114, a ring assembly 112, and a temperature control module configured to adjust at least one of the substrates to the target temperature. The temperature control module may include a heater, a heat transfer medium, a flow path, or any combination of these. A heat transfer fluid such as brine or a gas flows through the flow path. The substrate support 14 may include a heat transfer gas supply unit configured to supply a heat transfer gas between the back surface of the substrate W and the substrate support surface 111a and/or between the edge ring 25 and the annular region 111b.

<Configuration of the Substrate Processing System PS>

FIG. 4 is a figure schematically illustrating a substrate processing system PS in an exemplary embodiment of the present disclosure. The processing method may be executed using this substrate processing system PS.

The substrate processing system PS includes substrate processing modules PM1 to PM6 (referred to collectively as "the substrate processing modules PM" below), a transfer module TM, load lock modules LLM1 and LLM2 (referred to collectively as "the load lock modules LLM" below), a loader module LM, and load ports LP1 to LP3 (referred to collectively as "the load ports LP" below). The controller CT controls each configuration in the substrate processing system PS and executes predetermined processing on the substrate W.

The substrate processing modules PM internally perform on the substrate W processing such as etching processing, trimming processing, film formation processing, annealing processing, doping processing, lithography processing, cleaning processing, and ashing processing. One or more of the substrate processing modules PM may be a measuring module for measuring the film thickness of the film formed on the substrate W, the dimensions of the pattern formed on the substrate W, etc. The plasma processing apparatus 1 shown in FIG. 1 is one example of a substrate processing module PM.

The transfer module TM has a transfer apparatus for transferring substrates W, and transfers substrate W between substrate processing modules PM or between a substrate processing module PM and a load lock module LLM. The substrate processing modules PM and the load lock modules LLM are arranged adjacent to the transfer module TM. The transfer module TM, the substrate processing modules PM, and the load lock modules LLM are spatially isolated or connected to each other via a gate valve that can be opened and closed (in one example, the gate valve 12g in FIG. 1).

The load lock modules LLM1 and LLM2 are provided between the transfer module TM and the loader module LM. The pressure in the load lock module LLM can be switched to atmospheric pressure or to a vacuum. A load lock module LLM transfers a substrate W from an atmospheric pressure loader module LM to a vacuum transfer module TM, and also from a vacuum transfer module TM to an atmospheric pressure loader module LM.

The loader module LM has a transfer apparatus for transferring substrates W, and transfers substrates W between a load lock module LLM and a load port LP. A FOUP (front opening unified pod), for example, that can accommodate 25 substrates W or an empty FOUP can be placed in the load port LP. The loader module LM removes substrates W from the FOUP in the load port LP and transfers them to a load lock module LLM. The loader module LM also removes substrates W from the load lock module LLM and transfers them to the FOUP in the load port LP.

The controller CT controls each configuration in the substrate processing system PS and executes predetermined processing on substrates W. The controller CT stores recipes for processing procedures, processing conditions, and transfer conditions, etc. and controls each configuration in the board processing system PS to execute predetermined processing on substrates W based on the recipes. The controller CT may also include some or all of the functions of the controller 80 for the plasma processing apparatus 1 shown in FIG. 1.

<Example of a Substrate W>

FIG. 5 is a figure showing the cross-sectional structure of a substrate W. The substrate W is an example of a substrate that can be used in the processing method. The substrate W has a silicon-containing film SF and a carbon-containing film CF. The substrate W may also have an undercoat film UF and a mask film MK. As shown in FIG. 5, the substrate W may be formed by successively laminating the undercoat film UF, the silicon-containing film SF, the carbon-containing film CF, and the mask film MK in this order.

The undercoat film UF may be, for example, a silicon wafer, an organic film formed on a silicon wafer, a dielectric film, a metal film, or a semiconductor film. The undercoat film UF may be a laminated film formed by laminating a plurality of films.

The silicon-containing film SF may be a SiO-containing film. The silicon-containing film SF can be, for example, a multilayer film in which silicon oxide films and silicon nitride films have been alternately laminated. The silicon-containing film SF can be a silicon oxide film (SiOx film), a silicon nitride film, a silicon acid nitride film (SiON film), or a Si-ARC film. The silicon-containing film SF can include SiGe films and polycrystalline silicon films. The silicon-containing film SF can be a multilayer film in which silicon oxide films and polycrystalline silicon films have been alternately laminated.

The carbon-containing film CF can be, for example, an amorphous carbon film. When the carbon-containing film CF is an amorphous carbon film, the amorphous carbon can be hydrogen-containing amorphous carbon. The carbon-containing film CF can be, in one example, an organic film.

The undercoat film UF, the silicon-containing film SF and/or the carbon-containing film CF can be formed using, for example, the CVD method or the spin coating method. The undercoat film UF and/or the silicon-containing film SF can be a flat film or an uneven film.

The mask film MK is formed on the carbon-containing film CF. The mask film MK is used to define at least one opening OP on the carbon-containing film CF. An opening OP is a space on the carbon-containing film CF that is surrounded by side walls of the mask film MK. In FIG. 5, the upper surface of the carbon-containing film CF has a region covered by the mask film MK and a region exposed at the bottom of the opening OP.

The opening OP may have any shape on the substrate W in plan view (that is, when the substrate W is viewed from top to bottom in FIG. 5). The shape can be, for example, a circular shape, a linear shape, or a combination of a circular shape and a linear shape. The mask film MK may have a plurality of side walls, and the plurality of side walls may define a plurality of openings OP. The plurality of openings OP may each have a line shape, and may be arranged at regular intervals to form a line & space pattern. Alternatively, the plurality of openings OP may each have a hole shape and form an array pattern.

The mask film MK can be, for example, a silicon-containing film. The silicon-containing film may be a SiON film in one example. The mask film MK may also be an organic film or a metal-containing film. The organic film may be, for example, a spin-on carbon film (SOC), an amorphous carbon film, or a photoresist film. The metal-containing film may contain, for example, tungsten, tungsten carbide, or titanium nitride. The mask film MK may be formed, for example, using CVD method or the spin coating method. The opening OP may be formed by etching the mask film MK. The mask film MK may be formed by lithography.

<Example of the Processing Method>

FIG. 6 is a flowchart showing an example of the processing method. The processing method includes a step of precoating the inner walls of the chamber (ST1), a step of preparing a substrate (ST2), a step of etching a carbon-containing film (ST3), and a step of etching a silicon-containing film (ST4). In the example described below, the controller 80 shown in FIG. 1 or the controller CT shown in FIG. 4 controls each unit in the plasma processing apparatus 1 to perform the processing method on the substrate W shown in FIG. 5. Each step in the processing method can be performed by an inductively coupled plasma processing apparatus or a capacitively coupled plasma processing apparatus. In one example, steps ST1 to ST4 can be performed by a capacitively coupled plasma processing apparatus. In another example, steps ST1 to ST3 may be performed by an inductively coupled plasma processing apparatus, and step ST4 may be performed by an capacitively coupled plasma processing apparatus. In an inductively coupled plasma processing apparatus, the antenna is an example of an upper electrode.

(Step ST1: Precoat the Inner Walls of the Chamber)

In step ST1, a protective film is formed on at least a portion of the inner walls of the chamber 10 in the plasma processing apparatus 1. The protective film may be a carbon-containing film. First, the gas supply in the plasma processing apparatus 1 introduces a processing gas containing a carbon-containing gas into the chamber 10. The carbon-containing gas, in one example, contains one or more of CO, $CO_2$, COS, and hydrocarbons as a precursor. Examples of hydrocarbons include $CH_4$, $C_2H_2$, and $C_3H_6$. The radio frequency power supply 62 then supplies radio frequency power HF to the electrode or the upper electrode 30 in the substrate support 14. As a result, an electric field is generated between the upper electrode 30 and the substrate support 14, and plasma is formed from the processing gas (including the carbon-containing gas) in the inner space 10s. As a result, the carbon-containing film is deposited on at least a portion of the inner walls of the chamber 10, and a protective film is formed on at least a portion of the inner walls of the chamber 10. Note that reaction by-products in the etching process in step ST3 may form a portion of the protective film.

(Step ST2: Preparation of the Substrate)

In step ST2, a substrate W is prepared in the inner space 10s of the chamber 10. In the inner space 10s, the substrate W is arranged on the upper surface of the substrate support 14 (the surface facing the upper electrode 30) and is held in place on the substrate support 14 by the electrostatic chuck 20. At least some of the process of forming each configuration on the substrate W may be performed in the inner space 10s. In one example, the step of etching the mask film MK to form the opening OP may be performed in the same chamber as the step ST3 of etching the carbon-containing film (and the step ST4 of etching the silicon-containing film). In other words, the opening OP and the recessed portion RC described later may be formed continuously in the same chamber. The chamber may be one in a capacitively coupled plasma processing apparatus. If (a) the step of forming the opening OP in step ST2, (b) step ST3, and (c) step ST4 are performed consecutively in the same chamber, the mask film MK may be removed in step ST4. Some or all of each configuration on the substrate W may be formed by apparatus or chambers external to the plasma processing apparatus 1 (in another substrate processing module PM of the substrate processing system PS in FIG. 4) before the substrate W is transferred to the inner space 10s of the plasma processing apparatus 1 and arranged on the upper surface of the substrate support 14.

(Step ST3: Etching of the Carbon-Containing Film)

In step ST3, the carbon-containing film CF is etched. Step ST3 includes a step of setting the temperature of the substrate W to a first temperature (ST31), a step of supplying a first processing gas (ST32), and a step of generating plasma (ST33).

In step ST31, the temperature of the substrate W is set to a first temperature. The first temperature may be 0° C. or lower. In one example, the first temperature may be −30° C. or lower. Setting the temperature of the substrate W to the first temperature is not limited to directly measuring the temperature of the substrate W and adjusting the temperature of the substrate W so that the temperature of the substrate W reaches the first temperature. In one example, setting the temperature of the substrate W to the first temperature entails setting the temperature of the substrate support 14 on which the substrate W has been placed to the first temperature. In another example, setting the temperature of the substrate W to the first temperature entails setting the temperature of the substrate support 14 to a temperature different from the first temperature so that the temperature of the substrate W reaches the first temperature. "Setting" the temperature may also include inputting, selecting, or storing the temperature in the controller 80.

In step ST32, the gas supply supplies a first processing gas into the chamber 10. In the present embodiment, the carbon-containing film CF is an amorphous carbon film, and the first processing gas may contain $H_2O$ gas. The first processing gas may also contain Ar gas. When $H_2O$ gas is supplied to the chamber 10, $H_2O$ molecules are physically adsorbed on the surface of the substrate W. The surface on which $H_2O$ molecules are adsorbed includes the exposed portion of the upper surface of the carbon-containing film CF in the opening OP formed in the mask film MK (see FIG. 5). When the amorphous carbon film contains hydrogen atoms at a predetermined ratio, the first processing gas may contain an oxygen-containing gas together with $H_2O$ gas or instead of $H_2O$ gas. The oxygen-containing gas may be, in one example, $O_2$ gas. The first processing gas may contain a plurality of gases that can generate $H_2O$ gas in the chamber 10. In one example, the plurality of gases can be $H_2$ gas and $O_2$ gas.

In step ST33, the radio frequency power supply 62 supplies radio frequency power HF to the lower electrode 18 to form plasma in the chamber 10. The radio frequency power HF has a first frequency suitable for plasma generation. The first frequency may be, for example, a frequency in the range of 27 MHz to 100 MHz. The radio frequency power HF may also be supplied to the upper electrode 30 or the bias electrode 118. The bias power supply 64 supplies an electrical bias to a bias electrode 118. The electrical bias may be pulse waves (see FIG. 2). Each pulse in the electrical bias may be configured to include radio frequency power LF or pulse voltage. The electrical bias may be supplied to the lower electrode 18.

When the first processing gas is supplied to the chamber 10 and plasma is formed in the chamber 10, the $H_2O$ molecules adsorbed on the upper surface of the carbon-containing film CF react with the amorphous carbon contained in the carbon-containing film CF, and the carbon-containing film CF is etched.

FIG. 7 is a figure showing the cross-sectional structure of the substrate W during step ST3. As shown in FIG. 7, $H_2O$ molecules adsorbed on the upper surface of the carbon-containing film CF via the opening OP in the mask film MK react with the amorphous carbon contained in the carbon-containing film CF to form a recessed portion RC in the carbon-containing film CF. The recessed portion RC is defined by the side walls and the bottom surface BT of the carbon-containing film CF. When a recessed portion RC is formed in the carbon-containing film CF, the $H_2O$ molecules are physically adsorbed on the bottom surface BT, and the adsorbed $H_2O$ molecules are used as an etchant to etch the carbon-containing film CF further. In other words, the recessed portion RC becomes deeper.

FIG. 8 is a figure showing the cross-sectional structure of the substrate W after step ST3. As shown in FIG. 8, when etching is performed in step ST3 and the recessed portion RC reaches the silicon-containing film SF (that is, when the surface of the silicon-containing film SF is exposed in the recessed portion RC), step ST3 is ended. In step ST3, some of the silicon-containing film SF may be etched. In other words, in step ST3, some of the silicon-containing film SF may be overetched in the depth direction of the recessed portion RC.

(Step ST4: Etching of the Silicon-Containing Film)

Next, in step ST4, the silicon-containing film SF is etched. Step ST4 includes a step of setting the temperature of the substrate W to a second temperature (ST41), a step of supplying a second processing gas (ST42), and a step of generating plasma (ST43).

Step ST4 may be executed in the same chamber 10 as step ST3. In other words, after step ST3 has been executed in the chamber 10 of the plasma processing apparatus 1, step ST4 may be executed while the substrate W is arranged on the substrate support 14 in the same chamber 10. Alternatively, step ST4 may be executed in a chamber different from the chamber 10 in which step ST3 was executed. In one example, after step ST3 is performed in chamber 10 of the plasma processing apparatus 1, and the substrate W is transferred to a chamber other than that chamber 10 and placed on a substrate support in the chamber to perform step ST4. When the substrate W is transferred from the chamber 10 in which step ST3 was executed to a different chamber, the transfer path of the substrate W may remain in vacuum (in one example, at a pressure lower than atmospheric pressure). The different chamber may be a chamber in another processing module PM in the substrate processing system PS. In this case, the transfer module TM (see FIG. 4) may transfer the substrate W from the plasma processing apparatus 1 to another processing module PM. In one example, the substrate processing system PS may include a processing module PM that executes step ST3 and a processing module PM that executes step ST4. In another example, the processing module PM that executes step ST3 may be an inductively coupled plasma processing apparatus, and the processing module PM that executes step ST4 may be a capacitively coupled plasma processing apparatus.

In step ST41, the temperature of the substrate W is set to a second temperature. The second temperature may be lower than the first temperature. If the second temperature is lower than the first temperature, the second temperature may be, for example, −50° C. or less. The second temperature may be higher than the first temperature. In one example, when the second processing gas contains an adsorption promoting gas as described later, the second temperature may be 20° C. or lower.

In step ST42, the gas supply supplies the second processing gas to the chamber 10. The second processing gas may include a hydrogen- and fluorine-containing gas. The hydrogen- and fluorine-containing gas may be, in one example, hydrogen fluoride (HF) gas. The hydrogen- and fluorine-containing gas may include $C_xH_yF_z$ (where x, y and z are integers greater than or equal to 1; referred to below as a "hydrofluorocarbon").

The hydrofluorocarbon is, in one example, at least one of $CH_2F_2$, $CHF_3$, or $CH_3F$. The hydrofluorocarbons may contain more than one carbon atom. The hydrofluorocarbon may also contain three or four carbon atoms. The hydrofluorocarbon may be one type selected from, for example, $C_2HF_5$, $C_2H_2F_4$, $C_2H_3F_3$, $C_2H_4F_2$, $C_3HF_7$, $C_3H_2F_2$, $C_3H_2F_6$, $C_3H_2F_4$, $C_3H_3F_5$, $C_4H_5F_5$, $C_4H_2F_6$, $C5H2F10$ and c-$C_5H_3F_7$. In one example, the carbon-containing gas is at least one type selected from the group consisting of $C_3H_2F_4$ and $C_4H_2F_6$. $C_xH_yF_z$ may be linear or cyclic.

The second processing gas may contain both a hydrogen-containing gas and a fluorine-containing gas. The hydrogen-containing gas may be, for example, $H_2$, $NH_3$, $H_2O$, $H_2O_2$, or a hydrocarbon ($CH_4$, $C_3H_6$, etc.). In one example, the fluorine-containing gas may contain $NF_3$, $SF_6$, $WF_6$, $XeF_2$ or $C_uF_v$ (where u and v are integers greater than or equal to 1; referred to below as a "fluorocarbon"). Fluorocarbons are, in one example, at least one of $CF_4$, $C_3F_8$, $C_4F_6$, or $C_4F_8$.

The second processing gas may further contain, in one example, a carbon-containing gas. The carbon-containing gas can be at least one type from a group consisting of $C_aH_b$ (where a and b are integers greater than or equal to 1), $C_cF_d$ (where c and d are integers greater than or equal to 1) and $CH_eF_f$ (where e and f are integers greater than or equal to 1). $C_aH_b$ may be $CH_4$ or $C_3H_6$ in one example. $C_cF_d$ may be $CF_4$, $C_3F_8$, $C_4F_6$, or $C_4F_8$ in one example. $CH_eF_f$ may be $CH_2F_2$, $CHF_3$, or $CH_3F$ in one example.

When the second processing gas is supplied into the chamber 10, the etchant contained in the second processing gas is physically adsorbed on the surface of the substrate W. The etchant may be, in one example, a hydrogen fluoride (HF), hydrogen atoms and/or fluorine atoms. The surface on which the etchant is adsorbed includes the exposed portion of the recessed portion RC on the upper surface of the silicon-containing film SF (see FIG. 8).

The second processing gas may also contain another gas. The other gas may be, for example, a gas that promotes the adsorption of etchants on the surface of the silicon-containing membrane SF (referred to below as an "adsorption promoting gas"). In one example, if the second temperature is higher than the first temperature, the second processing gas may include an adsorption promoting gas. In one example, the adsorption promoting gas may be a phosphorus-containing gas or a nitrogen-containing gas.

A phosphorus-containing gas is a gas including phosphorus-containing molecules. The phosphorus-containing molecule may be an oxide such as tetraphosphorus pentoxide ($P_4O_{10}$), tetraphosphorus pentoxide ($P_4O_8$), or tetraphosphorus hexoxide ($P_4O_6$). Phosphorus pentoxide is sometimes called diphosphorus pentoxide ($P_2O_5$). The phosphorus-containing molecule may be phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), or a halide (phosphorus halide) such as phosphorus iodide ($PI_3$). The phosphorus-containing molecule may contain fluorine as the halogen element such as phosphorus fluoride. Alternatively, the phosphorus-containing molecule may contain a halogen element other than fluorine as the halogen element. The phosphorus-containing molecule may be a phosphoryl halide such as phosphoryl fluoride ($POF_3$), phosphoryl chloride ($POCl_3$), or phosphoryl bromide ($POBr_3$). The phosphorus-containing molecule may be phosphine ($PH_3$), calcium phosphide ($Ca_3P_2$, etc.), phosphoric acid ($H_3PO_4$), sodium phosphate ($Na_3PO_4$), or hexafluorophosphoric acid ($HPF_6$). The phosphorus-containing molecule may be a fluorophosphine ($H_gPF_h$). Here, the sum of g and h is 3 or 5. Examples of fluorophosphines include $HPF_2$ and $H_2PF_3$. The processing gas may contain one or more phosphorus-containing molecules among the phosphorus-containing molecules mentioned above as at least one phosphorus-containing molecule. For example, the processing gas may contain at least one of $PF_3$, $PCl_3$, $PF_5$, $PCl_5$, $POCl_3$, $PH_3$, $PBr_3$, or $PBr_5$ as at least one phosphorus-containing molecule. When each phosphorus-containing molecule in the processing gas is a liquid or a solid, each phosphorus-containing molecule can be vaporized using heat and supplied to the chamber 10. The nitrogen-containing gas may be, for example, a gas containing at least one selected from the group consisting of $NH_3$, $NF_3$ or $N_2$. The nitrogen-containing gas may be a combination of gases that produces $NH_3$ in the chamber 10 or on the surface of the substrate W.

In step ST43, the radio frequency power supply 62 supplies radio frequency power HF to the lower electrode 18 to form plasma in the chamber 10. The radio frequency power HF has a first frequency suitable for plasma generation. The first frequency may be, for example, a frequency in the range of 27 MHz to 100 MHz. The radio frequency power HF may be supplied to the upper electrode 30 or the bias electrode 118. The bias power supply 64 supplies an electrical bias to the bias electrode 118. The electrical bias may be pulse waves (see FIG. 2). Each pulse in the electrical bias may be configured to include radio frequency power LF or pulse voltage. The electrical bias may be supplied to the lower electrode 18. The level of the electrical bias power supplied in step ST43 (in one example, the effective value of the electrical bias power or the effective value of the absolute value of the direct current voltage) is higher than the power level of the electrical bias supplied in step ST32.

When the second processing gas is supplied to the chamber 10 and plasma is formed in the chamber 10, the etchant adsorbed on the upper surface of the silicon-containing membrane SF reacts with the silicon-containing membrane SF to etch the silicon-containing film SF.

FIG. 9 is a figure showing the cross-sectional structure of the substrate W during step ST4. As shown in FIG. 9, the etchant adsorbed on the upper surface of the silicon-containing film SF via the opening OP and in the recessed portion RC reacts with the silicon-containing film SF to further form the recessed portion RC in the silicon-containing film SF. The recessed portion RC is defined by the side walls and the bottom surface BT of the carbon-containing film CF and the silicon-containing film SF. When the recessed portion RC is formed in the silicon-containing film SF, the etchant is physically adsorbed on the bottom surface BT, and the silicon-containing film SF is etched further by the adsorbed etchant. In other words, the recessed portion RC becomes deeper.

FIG. 10 is a figure showing the cross-sectional structure of the substrate W after step ST4. As shown in FIG. 10, when etching is performed in step ST4 and the recessed portion RC reaches the undercoat film UF (that is, when the surface of the undercoat film UF is exposed in the recessed portion RC), step ST4 is ended. In step ST4, some of the undercoat film UF may be etched. In other words, in step ST4, some of the undercoat film UF may be overetched in the depth direction of the recessed portion RC.

Tests conducted to evaluate the treatment method will now be described. The present disclosure is not limited by the following testing.

(Test 1)

Test 1 is related to step ST3 (see FIG. 6) of the processing method. In Test 1, an amorphous carbon film formed on the substrate W was etched using the plasma processing apparatus 1 under the following conditions. The amorphous carbon film is an example of a carbon-containing film.

Processing gas: $H_2O$ gas, Ar gas
Set temperature: −70° C. to 0° C.
Chamber pressure: 25 mTorr
Radio frequency power HF: 60 MHz/100 W
Radio frequency power LF: 3.2 MHz/1000 W In Test 1, the amorphous carbon film was etched by changing the temperature of the substrate support 14, and the adsorption amount and etching rate of $H_2O$ molecules in the inner space 10s of the chamber 10 were measured during etching of the amorphous carbon film.

FIG. 11 is a graph showing the measurement results from Test 1. In FIG. 11, the horizontal axis denotes the temperature (° C.) of the substrate support 14. The vertical axis denotes the etching rate of the amorphous carbon film. As shown in FIG. 11, the etching rate of the amorphous carbon film is increasing a substrate support 14 temperature of about −30° C. In other words, when the temperature of the substrate support 14 is about −30° C. or less, the amount of $H_2O$ molecules physically adsorbed on the substrate W increases. Therefore, it was found that the amount of $H_2O$ molecules etched and consumed during etching of the amorphous carbon film increases and the etching rate increases.

(Test 2)

Test 2 is related to step ST4 (see FIG. 6) of the processing method. In Test 2, a silicon oxide film formed on the substrate W was etched using the plasma processing apparatus 1 under the following conditions.

Processing gas: HF (hydrogen fluoride) gas, Ar gas
Set temperature: −70° C. to 0° C.
Chamber pressure: 25 mTorr
Radio frequency power HF: 60 MHz/100 W
Radio frequency power LF: 3 MHz/1000 W In Test 2, the temperature of the substrate support 14 was changed to etch the silicon oxide film, and the etching rate of the silicon oxide film was measured.

FIG. 12 is a graph showing the measurement results from Test 2. In FIG. 12, the horizontal axis denotes the temperature (° C.) of the substrate support 14. The vertical axis denotes the etching rate of the silicon oxide film. As shown in FIG. 12, the etching rate of the silicon oxide film increases from a substrate support 14 temperature of about −40° C. In other words, when the temperature of the substrate support 14 is about −40° C. or less, the amount of HF (or hydrogen atoms and fluorine atoms) physically adsorbed on the substrate W increases. Therefore, it was found that during etching silicon oxide film, the amount of HF (or hydrogen atoms and fluorine atoms) etched and consumed increases, and the etching rate increases.

In one exemplary embodiment of the present disclosure, the etchant is physically adsorbed on the substrate as molecules to perform the etching process in both the etching process for a carbon-containing film (in one example, an amorphous carbon film) and the etching process for a silicon-containing film (in one example, a laminated film of a silicon oxide film and a silicon nitride film). In this way, the etching process for the carbon-containing film and the etching process for the silicon-containing film can be continuously executed in the same chamber in a capacitively coupling plasma processing apparatus. Therefore, in this exemplary embodiment, the throughput of the etching process can be improved.

In one exemplary embodiment of the present disclosure, in the etching process of a carbon-containing film, $H_2O$ molecules serving as an etchant are physically adsorbed on the substrate. This makes it possible to etch the carbon-containing film at a high etching rate without generating high-density plasma.

In one exemplary embodiment of the present disclosure, when a predetermined etching process and an etching process using a corrosive gas such as hydrogen fluoride are continuously performed in the same chamber, at least some of the inner wall of the chamber can be precoated with a protective film before performing the predetermined etching process. This makes it possible to suppress corrosion of the inner walls of a chamber during an etching process using, for example, hydrogen fluoride. As a result, chamber contamination caused by corrosion of the inner walls of the chamber can be suppressed.

Various exemplary embodiments were described above, but the present disclosure is not limited to these exemplary embodiments and various additions, omissions, substitutions, and changes may be made. Elements in different embodiments may also be combined to form other embodiments. For example, each step in the processing method may be performed using plasma processing apparatus with other sources of plasma, such as plasma processing apparatus using capacitively coupled plasma, inductively coupled plasma, microwave plasma, and ECR plasma. It should also be noted that the various embodiments of the present disclosure described herein are provided for illustrative purposes only and that various modifications can be made without departing from the scope and spirit of the present disclosure. Therefore, the various embodiments disclosed herein are not intended to be limitative, and the true scope and spirit of the present disclosure are set forth in the appended claims.

The present disclosure may include any of the following aspects.

(Aspect 1) A plasma processing method performed in a plasma processing device, the plasma processing method comprising:

preparing a substrate including a silicon-containing film and a carbon-containing film formed on the silicon-containing film;

setting a temperature of the substrate to a first temperature of 0° C. or less;

supplying $H_2O$ to the substrate using a first processing gas comprising at least one of (a) gas comprising hydrogen atoms and oxygen atoms, and (b) a first gas comprising hydrogen atoms and a second gas comprising oxygen atoms;

generating plasma from the first processing gas using a high frequency and etching the carbon-containing film;

setting the temperature of the substrate to a second temperature different from the first temperature;

supplying a second processing gas containing a hydrogen- and fluorine-containing gas or both a hydrogen-containing gas and a fluorine-containing gas to the substrate; and generating plasma from the second processing gas using a high frequency and etching the silicon-containing film.

(Aspect 2) The plasma processing method according to aspect 1, wherein the plasma processing device includes a plasma processing chamber, a substrate support disposed in the plasma processing chamber to support a substrate, and an upper electrode disposed in the plasma processing chamber opposite the substrate support, wherein the preparing a substrate includes placing the substrate on the substrate support, wherein the etching the carbon-containing film including supplying a high frequency to the substrate support or to the upper electrode to form plasma from the first processing gas in the plasma processing chamber to etch the carbon-containing film, and wherein the etching the silicon-containing film including supplying a high frequency to the substrate support or to the upper electrode to form plasma from the second processing gas in the plasma processing chamber to etch the silicon-containing film.

(Aspect 3) The plasma processing method according to aspect 1, wherein the plasma processing device includes a first plasma processing chamber and a second plasma processing chamber,
a first substrate support disposed in the first plasma processing chamber to support a substrate,
a first upper electrode disposed in the first plasma processing chamber opposite the first substrate support,
a second substrate support disposed in the second plasma processing chamber to support a substrate, and
a second upper electrode disposed in the second plasma processing chamber opposite the second substrate support,
wherein the preparing a substrate includes placing the substrate on the first substrate support,
wherein the etching the carbon-containing film includes supplying a high frequency to the first substrate support or to the first upper electrode to form plasma from the first processing gas in the plasma processing chamber to etch the carbon-containing film,
wherein the plasma processing method further comprises transferring the substrate from the first substrate support to the second substrate support,
wherein the setting the temperature of the substrate to a second temperature different from the first temperature includes setting the temperature of the substrate to the second temperature in the second substrate support,
and wherein the etching the silicon-containing film includes supplying a high frequency to the second substrate support or to the second upper electrode to form plasma from the second processing gas in the plasma processing chamber to etch the silicon-containing film.

(Aspect 4) The plasma processing method according to aspect 3, wherein the plasma processing device includes a transfer chamber connected to the first plasma processing chamber and the second plasma processing chamber,
wherein the pressure in the transfer chamber is lower than atmospheric pressure, and
wherein the transferring the substrate, the substrate is transferred from the first substrate support to the second substrate support via the transfer chamber.

(Aspect 5) The plasma processing method according to any one of aspects 1 to 4, wherein the second temperature is lower than the first temperature.

(Aspect 6) The plasma processing method according to any one of aspects 1 to 4, wherein the second temperature is higher than the first temperature.

(Aspect 7) The plasma processing method according to any one of aspects 1 to 6, wherein the carbon-containing film is an amorphous carbon film.

(Aspect 8) The plasma processing method of any one of aspects 1 to 7, wherein the oxygen atoms comprise $O_2$.

(Aspect 9) The plasma processing method of any one of aspects 1 to 8, wherein the hydrogen atoms comprise $H_2$.

(Aspect 10) The plasma processing method of any one of aspects 1 to 7, wherein the gas comprises $H_2O$.

(Aspect 11) The plasma processing method of any one of aspects 1 to to, wherein the setting the temperature of the substrate to the first temperature of 0° C. or less comprises setting the temperature of the substrate or a substrate support of the substrate to the first temperature.

(Aspect 12) A plasma processing method performed in a plasma processing device having a plasma processing chamber, the plasma processing method comprising:
supplying a carbon-containing gas to the plasma processing chamber;
generating plasma from the carbon-containing gas using a high frequency to form a protective film on at least a portion of the inner walls of the plasma processing chamber;
preparing a substrate including silicon-containing film and a carbon-containing film formed on the silicon-containing film in the plasma processing chamber;
supplying a first processing gas containing hydrogen atoms and oxygen atoms to the plasma processing chamber, the first processing gas comprising at least one of (a) gas comprising hydrogen atoms and oxygen atoms, and (b) a first gas comprising hydrogen atoms and a second gas comprising oxygen atoms, and supplying $H_2O$ to the substrate;
generating plasma from the first processing gas using a high frequency to etch the carbon-containing film;
supplying a second processing gas including a hydrogen- and fluorine-containing gas or a second processing gas including a hydrogen-containing gas and a fluorine-containing gas to the prepared substrate in the plasma processing chamber; and
supplying a high frequency to form plasma from the second processing gas and etch the silicon-containing film.

(Aspect 13) The plasma processing method according to aspect 12, further comprising:
setting a temperature of the substrate to a first temperature; and
setting a temperature of the substrate to a second temperature different from the first temperature, wherein
the etching the carbon-containing film, the carbon-containing film is etched after the substrate has been set to the first temperature, and
the etching the silicon-containing film, the silicon-containing film is etched after the substrate has been set to the second temperature.

(Aspect 14) The plasma processing method according to aspect 12 or 13, wherein the protective film is a carbon-containing film.

(Aspect 15) The plasma processing method according to any one of aspects 1 to 14, wherein the plasma processing device is a capacitively coupling-type plasma processing device.

(Aspect 16) The plasma processing method of any one of aspects 12 to 15, wherein the oxygen atoms comprise $O_2$, the hydrogen atoms comprise $H_2$, and wherein the gas comprises $H_2O$.

(Aspect 17) A plasma processing device comprising:
at least one plasma processing chamber;
a temperature controller that sets the temperature of the substrate in the at least one plasma processing chamber;
a gas supply configured to supply gas to the at least one plasma processing chamber;

a plasma forming unit configured to form plasma from the gas in the at least one plasma processing chamber; and a controller configured to control the temperature controller, the gas supply, and the plasma forming unit, wherein the controller executes controls to set the temperature of a substrate including a silicon-containing film and a carbon-containing film formed on the silicon-containing film to a first temperature of 0° C. or less, supply $H_2O$ to the substrate using a first processing gas comprising at least one of (a) gas comprising hydrogen atoms and oxygen atoms, and (b) a first gas comprising hydrogen atoms and a second gas comprising oxygen atoms;

form plasma from the first processing gas using a high frequency and etching the carbon-containing film;

set the temperature of the substrate to a second temperature different from the first temperature;

supply a second processing gas containing a hydrogen- and fluorine-containing gas or both a hydrogen-containing gas and a fluorine-containing gas to the substrate; and form plasma from the second processing gas using a high frequency and etching the silicon-containing film.

(Aspect 18) The plasma processing apparatus of aspect 17, wherein for the temperature of the substrate being set to the first temperature of 0° C. or less, the temperature of the substrate or a substrate support of the substrate is set to the first temperature.

(Aspect 19) A plasma processing system including a first plasma processing device having a first plasma processing chamber and a second plasma processing device having a second plasma processing chamber, the plasma processing system comprising:

a temperature controller that sets the temperature of a substrate arranged in the first plasma processing chamber and the second plasma processing chamber;

a gas supply configured to supply gas to the first plasma processing chamber and the second plasma processing chamber;

an inductively coupled plasma forming unit coupled to the first plasma processing chamber;

a capacitively coupled plasma forming unit coupled to the second plasma processing chamber; and a controller configured to control the temperature controller, the gas supply, the inductively coupled plasma generation unit, and the capacitively coupled plasma forming unit, wherein the controller executes controls to place a substrate including a silicon-containing film and a carbon-containing film formed on the silicon-containing film in the first plasma processing chamber, set the temperature of the substrate to a first temperature that is 0° C. or less;

supply $H_2O$ to the substrate using a first processing gas comprising at least one of (a) gas comprising hydrogen atoms and oxygen atoms, and (b) a first gas comprising hydrogen atoms and a second gas comprising oxygen atoms;

generating plasma from the first processing gas using a high frequency to etch the carbon-containing film;

placing the substrate with the etched carbon-containing film in the second plasma processing chamber;

setting the temperature of the substrate to a second temperature that is different from the first temperature;

supplying a second processing gas including a hydrogen- and fluorine-containing gas or both a hydrogen-containing gas and a fluorine-containing gas to the substrate; and generating plasma from the second processing gas using a high frequency to etch the silicon-containing film.

(Aspect 20) The plasma processing system of aspect 19, wherein for the temperature of the substrate being set to the first temperature that is 0° C. or less, the temperature of the substrate or a substrate support of the substrate is set to the first temperature.

The invention claimed is:

1. A plasma processing method performed in a plasma processing apparatus comprising a first plasma processing chamber, the plasma processing method comprising:

preparing a substrate including a silicon-containing film and a carbon-containing film formed on the silicon-containing film;

setting a temperature of the substrate to a first temperature of 0° C. or less;

supplying $H_2O$ in a gaseous state to the first plasma processing chamber as a first processing gas to supply the $H_2O$ to the carbon-containing film;

forming plasma from the first processing gas using a radio frequency and etching the carbon-containing film;

setting the temperature of the substrate to a second temperature different from the first temperature;

supplying a second processing gas containing a hydrogen- and fluorine-containing gas or both a hydrogen-containing gas and a fluorine-containing gas to the substrate; and forming plasma from the second processing gas using a radio frequency and etching the silicon-containing film.

2. The plasma processing method according to claim 1, wherein the plasma processing apparatus further includes:

a substrate support disposed in the first plasma processing chamber to support a substrate, and an upper electrode disposed in the first plasma processing chamber facing the substrate support, wherein the preparing a substrate includes placing the substrate on the substrate support, wherein the etching the carbon-containing film including supplying a radio frequency to the substrate support or to the upper electrode to form plasma from the first processing gas in the first plasma processing chamber to etch the carbon-containing film, and wherein the etching the silicon-containing film including supplying a radio frequency to the substrate support or to the upper electrode to generate plasma from the second processing gas in the first plasma processing chamber to etch the silicon-containing film.

3. The plasma processing method according to claim 1, wherein the plasma processing apparatus further includes:

a second plasma processing chamber, a first substrate support disposed in the first plasma processing chamber to support a substrate;

a first upper electrode disposed in the first plasma processing chamber facing the first substrate support;

a second substrate support disposed in the second plasma processing chamber to support a substrate; and a second upper electrode disposed in the second plasma processing chamber facing the second substrate support, wherein the preparing a substrate includes placing the substrate on the first substrate support, and wherein the etching the carbon-containing film includes supplying a radio frequency to the first substrate support or to the first upper electrode to form plasma from the first processing gas in the first plasma processing chamber to etch the carbon-containing film, wherein the plasma processing method further comprises transferring the substrate from the first substrate support to the second substrate support, wherein the setting the temperature of the substrate to a second temperature different from the first temperature includes setting the temperature of the substrate on the second substrate support to the second temperature, and the etching the silicon-containing film includes supplying a radio frequency to the second substrate support or to the second upper electrode to form plasma from the second processing gas in the second plasma processing chamber to etch the silicon-containing film.

4. The plasma processing method according to claim 3, wherein the plasma processing apparatus includes a transfer chamber connected to the first plasma processing chamber and the second plasma processing chamber, wherein a pressure in the transfer chamber is lower than atmospheric pressure, and wherein in the transferring the substrate, the substrate is transferred from the first substrate support to the second substrate support via the transfer chamber.

5. The plasma processing method according to claim 1, wherein the second temperature is lower than the first temperature.

6. The plasma processing method according to claim 1, wherein the second temperature is higher than the first temperature.

7. The plasma processing method according to claim 1, wherein the carbon-containing film is an amorphous carbon film.

8. The plasma processing method of claim 1, wherein the setting the temperature of the substrate to the first temperature of 0° C. or less comprises setting the temperature of the substrate or a substrate support of the substrate to the first temperature.

9. A plasma processing method performed in a plasma processing apparatus having a plasma processing chamber, the plasma processing method comprising:

supplying a carbon-containing gas to the plasma processing chamber;

forming plasma from the carbon-containing gas using a radio frequency to form a protective film on at least a portion of inner walls of the plasma processing chamber;

preparing a substrate including silicon-containing film and a carbon-containing film formed on the silicon-containing film in the plasma processing chamber;

supplying $H_2O$ in a gaseous state to the chamber as a first processing gas to supply the $H_2O$ to the carbon-containing film;

generating plasma from the first processing gas using a radio frequency to etch the carbon-containing film;

supplying a second processing gas including a hydrogen- and fluorine-containing gas or a second processing gas including a hydrogen-containing gas and a fluorine-containing gas to the substrate prepared in the plasma processing chamber; and supplying a radio frequency to form plasma from the second processing gas and etch the silicon-containing film.

10. The plasma processing method according to claim 9, further comprising:

setting a temperature of the substrate to a first temperature; and setting the temperature of the substrate to a second temperature different from the first temperature, wherein:

in the etching the carbon-containing film, the carbon-containing film is etched after the substrate has been set to the first temperature; and in the etching the silicon-containing film, the silicon-containing film is etched after the substrate has been set to the second temperature.

11. The plasma processing method according to claim 9, wherein the protective film is a carbon-containing film.

12. The plasma processing method according to claim 9, wherein the plasma processing apparatus is a capacitive coupling-type plasma processing apparatus.

* * * * *